United States Patent [19]
Drost et al.

[11] Patent Number: 6,020,765
[45] Date of Patent: Feb. 1, 2000

[54] FREQUENCY DIFFERENCE DETECTOR FOR USE WITH AN NRZ SIGNAL

[75] Inventors: Robert J. Drost, Palo Alto; Robert J. Bosnyak, San Jose, both of Calif.

[73] Assignee: Sun Microsystems, Inc., Palo Alto, Calif.

[21] Appl. No.: 08/866,653

[22] Filed: May 30, 1997

[51] Int. Cl.[7] .................................................. H03D 13/00
[52] U.S. Cl. .............................. 327/42; 327/102; 327/145
[58] Field of Search ..................................... 375/375, 374, 375/376, 327; 327/102, 42, 147, 156, 145

[56] References Cited

U.S. PATENT DOCUMENTS

| | | | |
|---|---|---|---|
| 3,663,884 | 5/1972 | Pattantyus | 327/42 |
| 3,863,156 | 1/1975 | Bogert | 375/327 |
| 3,934,205 | 1/1976 | Bogert | 375/327 |
| 4,015,083 | 3/1977 | Bellisio | 375/376 |
| 4,069,462 | 1/1978 | Dunn | 331/11 |
| 4,594,564 | 6/1986 | Yarborough, Jr. | 331/1 A |
| 4,720,687 | 1/1988 | Ostoich et al. | 331/1 A |
| 4,773,085 | 9/1988 | Cordell | 375/120 |
| 4,800,508 | 1/1989 | Frederich | 364/528.39 |
| 4,884,035 | 11/1989 | Cok et al. | 327/8 |
| 4,918,405 | 4/1990 | Herleikson | 331/11 |
| 4,932,041 | 6/1990 | Eiberger et al. | 375/376 |
| 4,945,303 | 7/1990 | Hwang et al. | 324/76.55 |
| 4,955,078 | 9/1990 | Chung | 455/244.1 |
| 4,975,594 | 12/1990 | Wiren | 327/40 |
| 5,014,352 | 5/1991 | Chung | 455/314 |
| 5,027,085 | 6/1991 | DeVito | 331/1 A |
| 5,173,927 | 12/1992 | Strömmer et al. | 375/327 |
| 5,302,916 | 4/1994 | Pritchett | 331/1 A |
| 5,525,935 | 6/1996 | Joo | 331/11 |
| 5,610,952 | 3/1997 | Yamanaka | 375/371 |
| 5,625,358 | 4/1997 | Wilson et al. | 341/143 |

FOREIGN PATENT DOCUMENTS

| | | |
|---|---|---|
| 0 502 739 | 9/1992 | European Pat. Off. . |
| 0 654 907 | 5/1995 | European Pat. Off. . |
| 0 732 830 | 9/1996 | European Pat. Off. . |

OTHER PUBLICATIONS

Cordell, R. et al., "A 50 Mhz Phase—and Frequency—Locked Loop", IEEE Journal of Solid–State Circuits, vol. SC–14, No. 4, Dec. 1979, pp. 1003–1010.

Lee, T.H. and Bulzacchelli, J.F., "A 155–Mhz Clock Recovery Delay—and Phase—Locked Loop", Reprinted from IEEE Journal of Solid–State Circuits, vol. SC–27, pp. 1736–1746, Dec. 1992, pp. 421–430.

Razavi, B., "Monolithic Phase–Locked Loops and Clock Recovery Circuits", IEEE Press, 1996, pp. 24–25.

*Primary Examiner*—Kenneth B. Wells
*Assistant Examiner*—Minh Nguyen
*Attorney, Agent, or Firm*—Skjerven, Morrill, MacPherson, Franklin & Friel, LLP

[57] ABSTRACT

A frequency difference detector includes a pulse generator that receives an NRZ signal and a reference signal and provides data pulses having first edges based on edges of the NRZ signal and second edges based on edges of the reference signal, a pulse router that routes consecutive ones of the data pulses to different signal paths, a voltage generator that receives the data pulses from the signal paths and provides voltage signals with amplitudes based on pulse widths of the data pulses, and a comparison circuit that receives the voltage signals and provides error pulses with amplitudes based on voltage differences between the voltage signals. The amplitudes of the error pulses represent a frequency difference between the NRZ signal and the reference signal. Preferably, the data pulses have leading edges based on edges of the NRZ signal and the lagging edges based on leading edges of the reference signal immediately following the edges of the NRZ signal. It is also preferred that the error pulses have a repetition rate that corresponds to the edges of the NRZ signal, a current amplitude that is proportional to the frequency difference between the NRZ signal and the reference signal, and a polarity that represents a sign of the frequency difference between the NRZ signal and the reference signal. The frequency difference detector is well-suited for use in a frequency/phase-locked loop that provides a clock recovery circuit.

65 Claims, 12 Drawing Sheets

FREQUENCY DIFFERENCE DETECTOR FOR USE WITH AN NRZ SIGNAL

BACKGROUND OF THE INVENTION

1. Field of the Invention

The present invention relates to digital data transmission, and more particularly to a frequency difference detector for use in a frequency/phase-locked loop clock recovery system.

2. Description of Related Art

Digital signals are widely used in telecommunication systems for transmission of multiplexed pulse code modulated (PCM) voice channels over twisted pair, coaxial cable, or optical fiber media. Digital signals originate with sharply defined transitions and a consistent bit rate, but this well-defined form is eroded by loss, dispersion and noise in the transmission media. Regularly spaced regenerators are used to reconstruct the data stream, however the restored transitions do not generally match the original transition times. The new transitions tend to vary randomly about the nominal transition time. In this context, jitter is defined as abrupt, spurious variations in the phase of successive pulses, as compared with the phase of a continuous oscillator.

A digital signal which contains a binary data signal and a clocking signal in combination is referred to as a return to zero (RZ) signal, whereas a digital signal which contains a binary data signal without a clocking signal is referred to as a non return to zero (NRZ) signal (i.e., simple binary). NRZ signals require only one half the bandwidth of RZ signals, but the receiving unit must include complex circuitry to derive the bit cell timing.

Many such receiving units use phase-locked loop clock recovery systems for synchronizing a local oscillator with the NRZ signal. The phase-locked loop typically includes a phase detector that detects the phase difference between the NRZ signal and a reference signal, a low pass filter that filters an error signal generated by the phase detector, and a voltage controlled oscillator that receives the filtered error signal and generates the reference signal. In this manner, the reference signal "locks" on the frequency of the NRZ signal. A phase-locked loop can lock onto a very small spectral component in a data stream so that long strips of one's or zero's have a negligible effect on timing phase or amplitude. Thus, a phase-locked loop can be used to fill in the missing pulses in a data stream and eliminate jitter.

Conventional phase-locked loops require a design trade-off between stability and capture range. This limitation has been partially overcome by frequency/phase-locked loops which use a frequency-locked loop during an acquisition mode when the capture range is of primary concern. Once the proper frequency is locked, the loop is dominated by a parallel phase-locked loop which provides stability during steady-state operation.

FIG. 1 shows a frequency/phase-locked loop disclosed in Cordell et al., "A 50 Mhz Phase- and Frequency-Locked Loop," IEEE Journal of Solid-State Circuits, Vol. SC-14, No. 6, December 1979, pp. 1003–1010, which is incorporated by reference. The phase-locked loop includes phase detector 12, and the frequency-locked loop includes frequency difference detector 14. The phase-locked loop and frequency-locked loop share low-pass filter 16 and voltage controlled oscillator 18. Phase detector 12 is a Hogge phase detector. Low-pass filter 16 is a conventional lead-lag circuit in which the reactive elements provide a zero frequency and a pole frequency, the gain is constant below the zero frequency and above the pole frequency, and the gain increases between the zero and pole frequencies. Voltage controlled oscillator 18 produces the reference signal as a train of clock pulses, the frequency of which is dependent upon the voltage at its control input.

FIG. 2 shows frequency difference detector 14, which includes parallel in-phase and quadrature branches. The in-phase branch includes phase detector 20, low-pass filter 22 and quantizer 24. The quadrature branch includes 90-degree phase shifter 26, quadrature phase detector 28, low-pass filter 30, quantizer 32 and differentiator 34. A square wave generated by quantizer 24 and alternating polarity pulses generated by the differentiator 34 are multiplied by phase detector 36 to provide slip pulses at the output. The amplitude of the slip pulses corresponds to the frequency difference between the NRZ signal and the reference signal, and the polarity of the slip pulses represents the sign of the frequency difference. For instance, if the NRZ signal has a greater frequency than the reference signal then the slip pulses have positive polarity, and if the NRZ signal has a smaller frequency than the reference signal then the slip pulses have negative polarity.

Frequency difference detector 14 has several disadvantages. For instance, differentiator 34 includes a capacitor and a resistor, and a well-controlled tub resistor is particularly difficult to implement with submicron CMOS processes. Another disadvantage is the low repetition rate of the slip pulses, which corresponds to twice the frequency difference between the NRZ signal and the reference signal. A further disadvantage is the high latency of the slip pulses, which are shifted by about 90 degrees with respect to the frequency difference between the NRZ signal and the reference signal, which necessitates disabling the frequency-locked loop when the reference signal is locked.

Accordingly, a need exists for a frequency difference detector that provides output pulses with a high repetition rate and low latency and that need not include a phase shifter or a tub resistor.

SUMMARY OF THE INVENTION

The present invention provides a frequency difference detector which fulfills the need in the art described above. Broadly speaking, the frequency difference detector compares the pulse widths of data pulses based on the NRZ signal and the reference signal, and generates an error signal based on the comparison.

In accordance with one aspect of the invention, a frequency difference detector includes a pulse generator that receives an NRZ signal and a reference signal and provides data pulses having first edges based on edges of the NRZ signal and second edges based on edges of the reference signal, a pulse router that routes consecutive ones of the data pulses to different signal paths, a voltage generator that receives the data pulses from the signal paths and provides voltage signals with amplitudes based on pulse widths of the data pulses, and a comparison circuit that receives the voltage signals and provides error pulses with amplitudes based on voltage differences between the voltage signals. The amplitudes of the error pulses represent a frequency difference between the NRZ signal and the reference signal.

Preferably, the data pulses have leading edges based on edges of the NRZ signal and lagging edges based on leading edges of the reference signal immediately following the edges of the NRZ signal. It is also preferred that the error pulses have a repetition rate that corresponds to the edges of the NRZ signal, a current amplitude that is proportional to the frequency difference between the NRZ signal and the reference signal, and a polarity that represents a sign of the frequency difference between the NRZ signal and the reference signal.

Preferably, the pulse generator includes an edge difference-to-pulse converter, the pulse router includes a multiplexer that routes the data pulses to first, second, third and fourth signal paths in sequence, the voltage generator includes first, second, third and fourth pulse width-to-voltage converters coupled to the first, second, third and fourth signals paths, respectively, and the comparison circuit includes first, second, third and fourth voltage difference-to-current converters coupled to the first and second, second and third, third and fourth, and first and fourth voltage converters, respectively.

During a first time period in which only one edge of the NRZ signal occurs, the pulse router routes one of the data pulses to the first voltage converter, a second reset signal resets the second voltage converter to a reference voltage, the third and fourth voltage converters provide two of the voltage signals based on a previous pair of the data pulses, and a third enable signal allows the third current converter to generate one of the error pulses.

During a second time period in which only one edge of the NRZ signal occurs, the pulse router routes one of the data pulses to the second voltage converter, a third reset signal resets the third voltage converter to the reference voltage, the first and fourth voltage converters provide two of the voltage signals based on a previous pair of the data pulses, and a fourth enable signal allows the fourth current converter to generate one of the error pulses.

During a third time period in which only one edge of the NRZ signal occurs, the pulse router routes one of the data pulses to the third voltage converter, a fourth reset signal resets the fourth voltage converter to the reference voltage, the first and second voltage converters provide two of the voltage signals based on a previous pair of the data pulses, and a first enable signal allows the first current converter to generate one of the error pulses.

During a fourth time period in which only one edge of the NRZ signal occurs, the pulse router routes one of the data pulses to the fourth voltage converter, a first reset signal resets the first voltage converter to the reference voltage, the second and third voltage converters provide two of the voltage signals based on a previous pair of the data pulses, and a second enable signal allows the second current converter to generate one of the error pulses.

The frequency difference detector is well-suited for use in a frequency/phase-locked loop that provides a clock recovery circuit. Advantageously, the frequency difference detector provides the error pulses with a high repetition rate and low latency, and can be implemented without a phase shifter or a tub resistor.

These and other aspects, features and advantages of the invention will be further described and more readily apparent from a review of the detailed description of the preferred embodiments which follows.

DETAILED DESCRIPTION OF THE PREFERRED EMBODIMENTS

Figure 1:
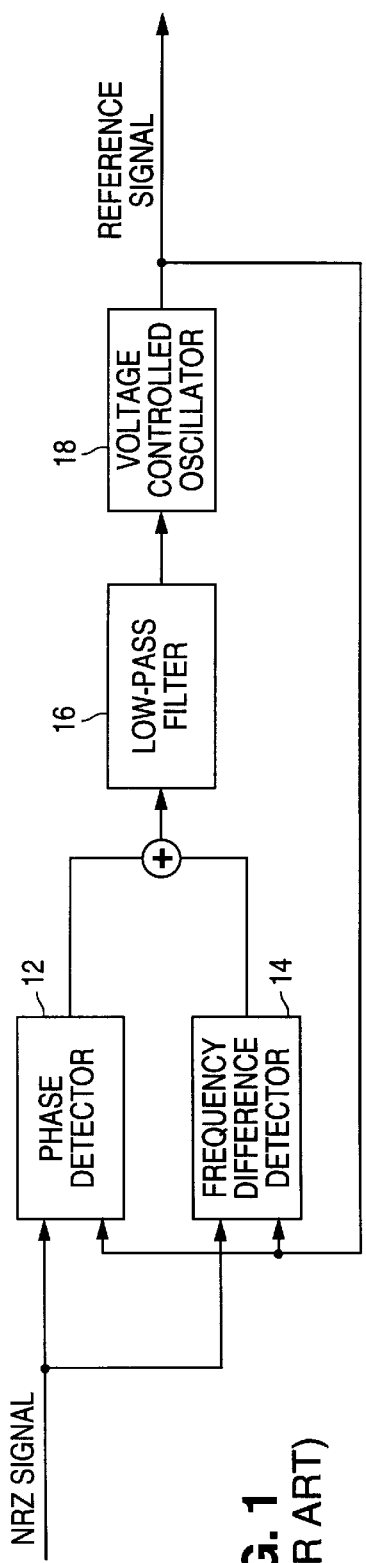
FIG. 1 shows a conventional frequency/phase-locked loop.
Figure 2:
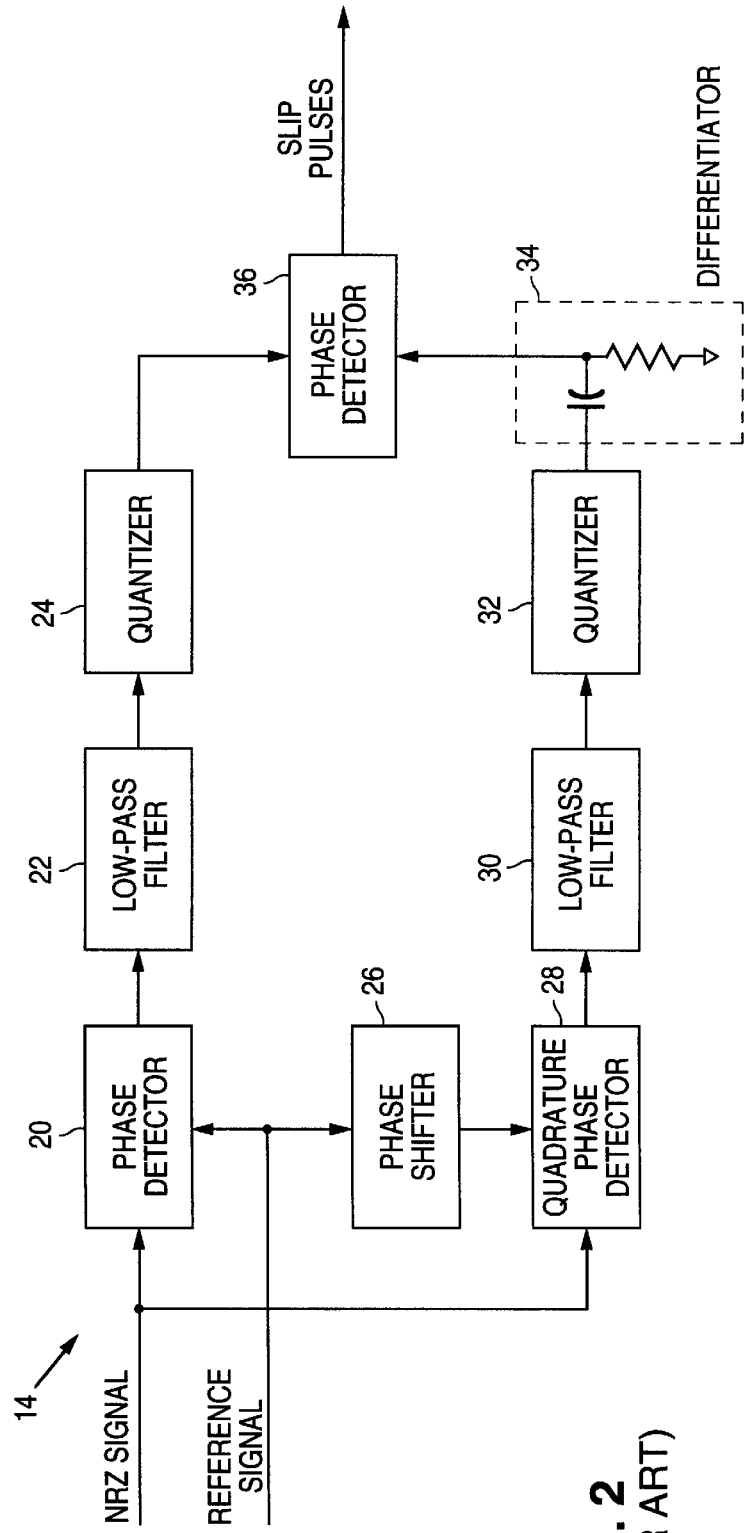
FIG. 2 shows a conventional frequency difference detector used in the circuit of FIG. 1.
Figure 3:
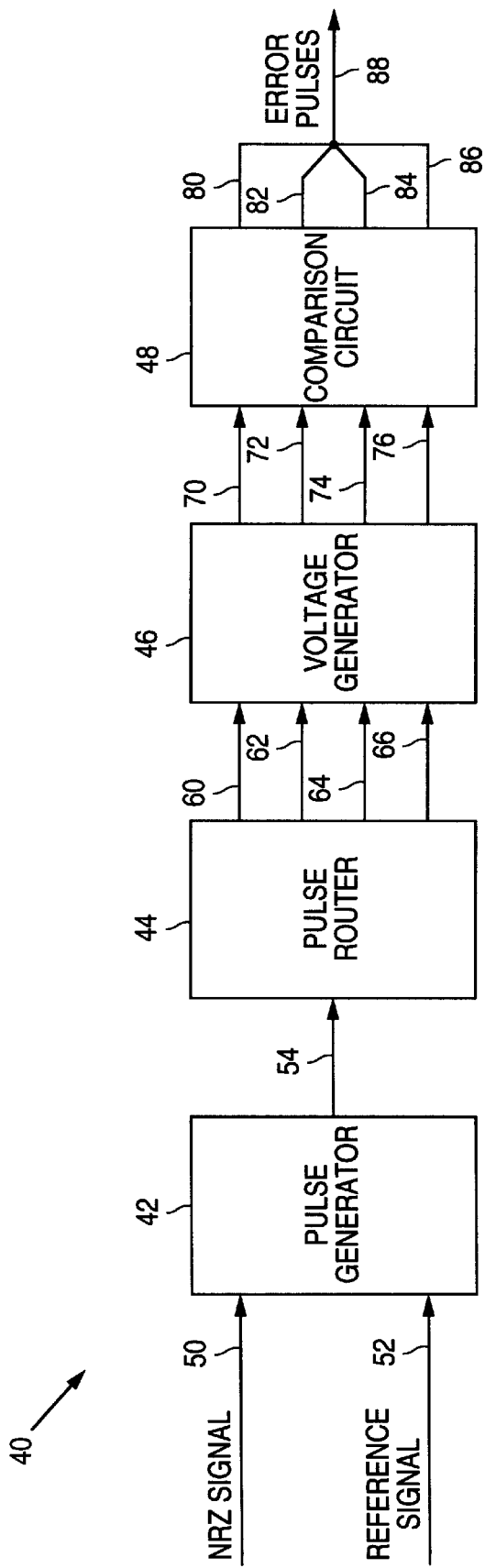
FIG. 3 shows a frequency difference detector in accordance with an embodiment of the present invention.

FIG. 3 shows a frequency difference detector 40 in accordance with an embodiment of the present invention. Detector 40 includes pulse generator 42, pulse router 44, voltage generator 46 and comparison circuit 48.

Pulse generator 42 receives a unipolar NRZ signal at signal path 50 and a reference signal at signal path 52 and provides a data signal at signal path 54 in response to the NRZ signal and the reference signal. The NRZ signal, reference signal and data signal are all digital signals that include pulses with edges (or transitions) between first states (logical "0") and second states (logical "1"). Preferably, these signals are implemented as differential signals to improve noise immunity. For illustration purposes, the data pulses have leading edges based on edges of the NRZ signal and lagging edges based on leading edges of the reference signal immediately following the edges of the NRZ signal. Of course, other approaches can be used. For instance, the data pulses can have lagging edges based on lagging edges of the reference signal immediately following the edges of the NRZ signal. It is preferred that one data pulse is generated for each edge of the NRZ signal, that is, the data pulses have a repetition rate that corresponds to the edges of the NRZ signal. It is also preferred that each data pulse have a leading edge based on an edge of the NRZ signal and a lagging edge based on a "trigger" edge (either a leading or lagging edge) of the NRZ signal which immediately follows the edge of the NRZ signal. In addition, at least one trigger edge of the NRZ signal should occur between each pair of edges in the NRZ signal.

Pulse router 44 receives the data pulses from signal path 54 and routes consecutive ones of the data pulses to signals paths 60, 62, 64 and 66 in sequence. For instance, if the data pulses include first, second, third, fourth and fifth data pulses that occur consecutively and in sequence, pulse router 44 routes the first data pulse to signal path 60, the second data pulse to signal path 62, the third data pulse to signal path 64, the fourth data pulse to signal path 66, and the fifth data pulse to signal path 60. Accordingly, pulse router 44 routes consecutive data pulses to selected ones of signal paths 60, 62, 64 and 66 in round-robin fashion.

Voltage generator 46 receives the data pulses from signal paths 60, 62, 64 and 66 and provides voltage signals at signal paths 70, 72, 74 and 76. The voltage signals have amplitudes based on the pulse widths of the data pulses. In particular, the voltage signal at signal path 70 has a voltage amplitude based on the pulse width of the first data pulse received at signal path 60, the voltage signal at signal path 72 has a voltage amplitude based on the pulse width of the second data pulse received at signal path 62, the voltage signal at signal path 74 has a voltage amplitude based on the pulse width of the third data pulse received at signal path 64, and the voltage signal at signal path 76 has a voltage amplitude based on the pulse width of the fourth data pulse received at signal path 66. Voltage generator 46 stores the voltage signals at signal paths 70, 72, 74 and 76 for a limited time after the respective data pulses occur in order to simultaneously provide pairs of voltage signals, but signal paths 70, 72, 74 and 76 are periodically reset to a reference voltage so that each voltage signal is based on only one data pulse. For instance, the voltage signal at signal path 70 is stored when the second data pulse is received at signal path 62, and the voltage signals at signals paths 70 and 72 are simultaneously provided. However, signal path 70 is reset to a reference voltage when the fourth data pulse is received at signal path 66 so that the first data pulse has no affect on the voltage signal at signal path 70 when the fifth data pulse arrives. Signal paths 72, 74 and 76 are periodically reset to the reference voltage in a similar manner. Accordingly, voltage generator 46 provides pairs of voltage signals, with amplitudes based on pulse widths of consecutive data pulses, at selected pairs of signal paths 70, 72, 74 and 76 in round-robin fashion.

Comparison circuit 48 receives the voltage signals from signal paths 70, 72, 74 and 76 and provides error pulses at signal paths 80, 82, 84 and 86 which are coupled to signal path 88. The error pulses have amplitudes and polarities based on voltage differences between respective pairs of the voltage signals. For illustration purposes, the amplitudes are current amplitudes, the polarities are positive when the second voltage signal exceeds the first voltage signal, and the polarities are negative when the second voltage signal is less than the first voltage signal. For instance, the error pulses at signal path 80 have current amplitudes based on the voltage difference between the voltage signals at signal paths 70 and 72, the error pulses at signal path 82 have current amplitudes based on the voltage difference between the voltage signals at signal paths 72 and 74, the error pulses at signal path 84 have current amplitudes based on the voltage difference between the voltage signals at signal paths 74 and 76, and the error pulses at signal path 86 have current amplitudes based on the voltage difference between the voltage signals at signal paths 76 and 70. The error pulses at signal path 80 have positive polarity when the voltage signal at signal path 72 exceeds the voltage signal at signal path 70, the error pulses at signal path 82 have positive polarity when the voltage signal at signal path 74 exceeds the voltage signal at signal path 72, the error pulses at signal path 84 have positive polarity when the voltage signal at signal path 76 exceeds the voltage signal at signal path 74, and the error pulses at signal path 86 have positive polarity when the voltage signal at signal path 70 exceeds the voltage signal at signal path 76. Similarly, the error pulses at signal path 80 have negative polarity when the voltage signal at signal path 72 is less than the voltage signal at signal path 70, the error pulses at signal path 82 have negative polarity when the voltage signal at signal path 74 is less than the voltage signal at signal path 72, the error pulses at signal path 84 have negative polarity when the voltage signal at signal path 76 is less than the voltage signal at signal path 74, and the error pulses at signal path 86 have negative polarity when the voltage signal at signal path 70 is less than the voltage signal at signal path 76. Each of the error pulses flows through signal path 88.

Comparison circuit 48 generates the error pulses while the respective voltage signals are provided, and signal paths 80, 82, 84, and 86 are periodically reset to zero current so that each error pulse is based on only one pair of voltage signals. For instance, when voltage generator 46 stores the voltage signals at signal paths 70 and 72 and receives the third data pulse at signal path 64, comparison circuit 48 generates an error pulse at signal path 80 based on the voltage signals at signal paths 70 and 72. Thereafter, when voltage generator 46 stores voltage signals at signal paths 72 and 74 and receives the fourth data pulse at signal path 66, comparison circuit 48 resets signal path 80 to zero current and generates an error pulse at signal path 82 based on the voltage signals at signal paths 72 and 74. Signal paths 82, 84 and 86 are periodically reset to zero current in a similar manner. Accordingly, comparison circuit 48 provides error pulses, with current amplitudes and polarities based on voltage differences between pairs of voltage signals, at selected ones of signal paths 80, 82, 84 and 86 in round-robin fashion, and the error pulses are output at signal path 88.

The pulse widths of the data pulses vary in response to a frequency variation between the NRZ signal and the reference signal. When the NRZ signal and the reference signal have identical frequencies then consecutive data pulses have identical pulse widths, the respective voltage signals have the identical voltage amplitudes, and the error pulses are not be generated (or have negligible amplitudes). On the other hand, when the NRZ signal and the reference signal have different frequencies, a phase shift occurs between the edges of the NRZ signal and the edges of the reference signal, in which case consecutive data pulses have different pulse widths, the respective voltage signals have different voltage amplitudes, and the error pulses have amplitudes proportional to the frequency difference and polarities reflecting the sign of the frequency difference. Thus, the frequency difference between the NRZ signal and the reference signal is detected by comparing the pulse widths of data pulses based on these signals.

Figure 4:
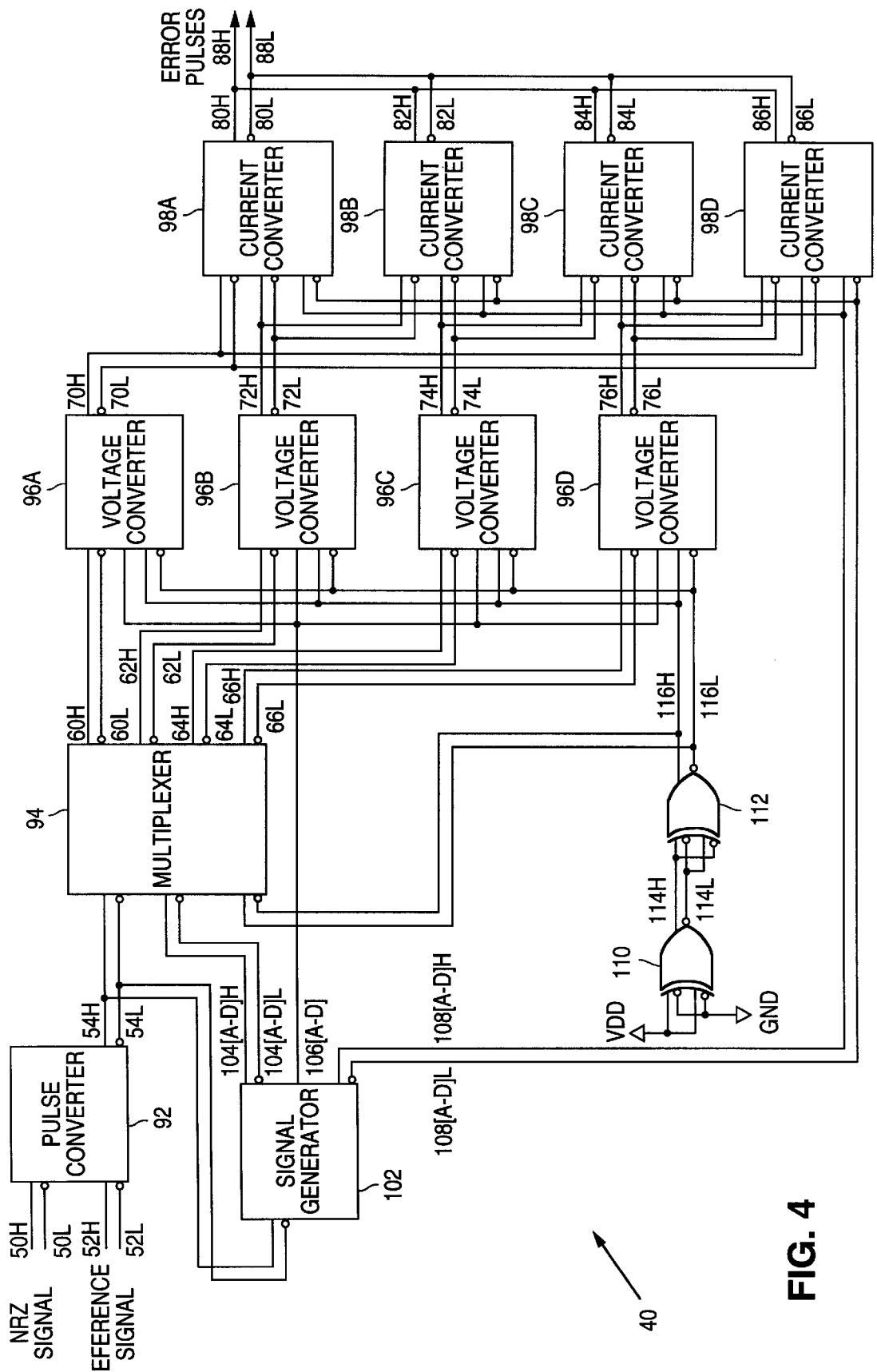
FIG. 4 shows an implementation for the frequency difference detector in FIG. 3.

FIG. 4 shows an implementation for frequency difference detector 40. Pulse generator 42 is implemented by edge difference-to-pulse converter 92. Pulse router 44 is implemented by multiplexer 94. Voltage generator 46 is implemented by pulse width-to voltage converters 96A, 96B, 96C and 96D. Comparison circuit 48 is implemented by voltage difference-to-current converters 98A, 98B, 98C and 98D.

The signals are generally implemented as differential signals, and therefore the signal paths generally have dual paths. For instance, signal path 50 includes signal paths 50H and 50L for transferring the NRZ signal as a differential signal, signal path 52 includes signal paths 52H and 52L for transferring the reference signal as a differential signal, etc. The "H" signal paths use positive logic, that is, a high level is logical "1" and a low level is logical "0". The "L" signal paths, which are complementary to the "H" signal paths, use negative logic in which a high level is logical "0" and a low level is logical "1". The "L" inputs and outputs of the devices are shown with protruding circles. The differential signals include complementary signals with edges that cross each other at about the 50% point between the high and low levels as is well-known in the art.

Signal generator 102 receives the data pulses from signal paths 54H and 54L and provides timing signals for multiplexer 94, voltage converters 96A–96D and current converters 98A–98D in response to the data pulses. In particular, signal generator 102 provides control signals at signal paths 104[A–D]H and 104[A–D]L for multiplexer 94, reset signals at signal paths 106[A–D] for voltage converters 96A–96D, respectively, and enable signals at signal paths 108[A–D]H and 108[A–D]L for current converters 98A–98D, respectively. For instance, signal paths 106[A–D] provide signal path 106A for voltage converter 96A, signal path 106B for voltage converter 96B, signal path 106C for voltage converter 96C, and signal path 106D for voltage converter 96D. Likewise, signal paths 108AH and 108AL are provided for current converter 98A, signal paths 108BH and 108BL are provided for current converter 98B, signal paths 108CH and 108CL are provided for current converter 98C, and signal paths 108DH and 108DL are provided for current converter 98D. Signals paths 106[A14 D] operate with positive logic (like "H" signal paths) but have no "L" counterparts.

Exclusive-OR (XOR) gates 110 and 112 provide dummy signals for multiplexer 94 and voltage converters 96A–96D. XOR gate 110 has its "H" inputs coupled to the supply voltage VDD (3.3 volts) and its "L" inputs coupled to GND (0 volts), and therefore generates a low signal at signal path 114H and a high signal at signal path 114L. XOR gate 112 has its "H" inputs coupled to signal paths 114H and 114L and its "L" inputs coupled to signal paths 114H and 114L, and therefore generates a high dummy signal at signal path 116H and a low dummy signal at signal path 116L. Signal paths 116H and 116L couple the dummy signals to multiplexer 94 and voltage converters 96A–96D. The high dummy signal has a voltage level similar to the high level of the data pulses (about 2.8 to 3.3 volts), and the low dummy signal has a voltage level similar to the low level of the data pulses (about 1 to 2 volts). Thus, the high dummy signal at signal path 116H represents a logical "1" at the "H" signal paths and a logical "0" at the "L" signal paths, and the low dummy signal at signal path 116L represents a logical "1" at the "L" signal paths and a logical "0" at the "H" signal paths. For instance, the data pulses at signal path 54A having leading edges that transition between a low level (similar to the low dummy signal) and a high level (similar to the high dummy signal).

Multiplexer 94 has two data inputs and four data outputs. The first data input has its "H" input coupled to signal path 54H and its "L" input coupled to signal path 54L, and the second data input has its "H" input coupled to signal path 116L and its "L" input coupled to signal path 116H. Thus, the second data input receives the equivalent of a constant logical "0" or absence of a data pulse. Multiplexer 94 also has a control input for receiving control signals from signal paths 104[A–D]H and 104[A–D]L that control the multiplexing operation. Any time one of the differential control signals is asserted (logical "1") the other three differential control signals are deasserted (logical "0"). Therefore, multiplexer 94 couples the first data input to a selected one of the data outputs and couples the second data input to the other three data outputs. When the control signals at signal paths 104AH and 104AL are asserted the control signals at signal paths 104[B–D]H and 104[B–D]L are deasserted, multiplexer 94 couples signal paths 54H and 54L to signal paths 60H and 60L and couples signal paths 116L and 116H to signal paths 62H and 62L, 64H and 64L, and 66H and 66L. This routes any data pulse at signal paths 54H and 54L only to signal paths 60H and 60L. When the control signals at signal paths 104BH and 104BL are asserted the control signals at signal paths 104[A,C,D]H and 104[A,C,D]L are deasserted, multiplexer 94 couples signal paths 54H and 54L to signal paths 62H and 62L and couples signal paths 116L and 116H to signal paths 60H and 60L, 64H and 64L, and 66H and 66L. This routes any data pulse at signal paths 54H and 54L only to signal paths 62H and 62L. When the control signals at signal paths 104CH and 104CL are asserted the control signals at signal paths 104[A,B,D]H and 104[A,B,D]L are deasserted, multiplexer 94 couples signal paths 54H and 54L to signal paths 64H and 64L and couples signal paths 116L and 116H to signal paths 60H and 60L, 62H and 62L, and 66H and 66L. This routes any data pulse at signal paths 54H and 54L only to signal paths 64H and 64L. Finally, when the control signals at signal paths 104DH and 104DL are asserted control the signals at signal paths 104[A–C]H and 104[A–C]L are deasserted, multiplexer 94 couples signal paths 54H and 54L to signal paths 66H and 66L and couples signal paths 116L and 116H to signal paths 60H and 60L, 62H and 62L, and 64H and 64L. This routes any data pulse at signal paths 54H and 54L only to signal paths 66H and 66L.

Voltage converters 96A–96D are identical to one another. Voltage converter 96A has two data inputs and one data output. The first data input has its "H" input coupled to signal path 60H and its "L" input coupled to signal path 60L, and the second data input has its "H" input coupled to signal path 116H and its "L" input coupled to signal path 116L. Voltage converter 96A also has a reset input for receiving a reset signal at signal path 106A. When the reset signal at signal path 106A is asserted, the voltage signals at signal paths 70H and 70L are forced to a reference voltage. Thereafter, when the reset signal at signal path 106A is deasserted, the voltage signals at signal paths 70H and 70L depend on the voltages at the inputs. In the absence of a data pulse at signal paths 60H and 60L, the voltages at the two inputs of voltage converter 96A offset one another, and as a result, voltage converter 96A continues to provide the reference voltage at signal paths 70H and 70L. When, however, a data pulse is received at signal paths 60H and 60L, this causes the voltage signals at signal paths 70H and 70L to move away from the reference voltage by an amount directly proportional to the pulse width of the data pulse. After the data pulse is finished, voltage converter 96A stores the voltage signals at signal paths 70H and 70L until the reset signal at signal path 106A is asserted again. Furthermore, the reset signal at signal path 106A is always asserted between consecutive data pulses at signal paths 60H and 60L. Voltage converters 96B–96D operate in the same manner with their respective signal paths.

Current converters 98A–98D are identical to one another. Current converter 98A has two data inputs and one data output. The first data input has its "H" input coupled to signal path 70H and its "L" input coupled to signal path 70L, and the second data input has its "H" input coupled to signal path 72H and its "L" input coupled to signal path 72L. Current converter 98A also has enable inputs for receiving enable signals at signal paths 108AH and 108AL. When the enable signals at signal paths 108AH and 108AL are deasserted, the current at signal paths 80H and 80L is forced to zero. When, however, the enable signals at signal paths 108AH and 108AL are asserted, current converter 98A generates currents at signal paths 80H and 80L with an amplitude proportional to and a polarity that represents the voltage difference between the voltage signals at signal paths 70H and 70L and the voltage signals at signal paths 72H and 72L. For instance, if voltage signals at signal paths 72H and 72L differ from the reference voltage by $V_1$ volts and the voltage signals at signal paths 70H and 70L differ from the reference voltage by $V_2$ volts, then the current at signal paths 80H and 80L will be $K(V_1-V_2)$ volts where K is a constant. Current converters 98B–98D operate in the same manner with their respective signal paths.

Frequency difference detector 40 is implemented with CMOS digital technology and, advantageously, without a phase shifter or a tub resistor.

Figure 5:
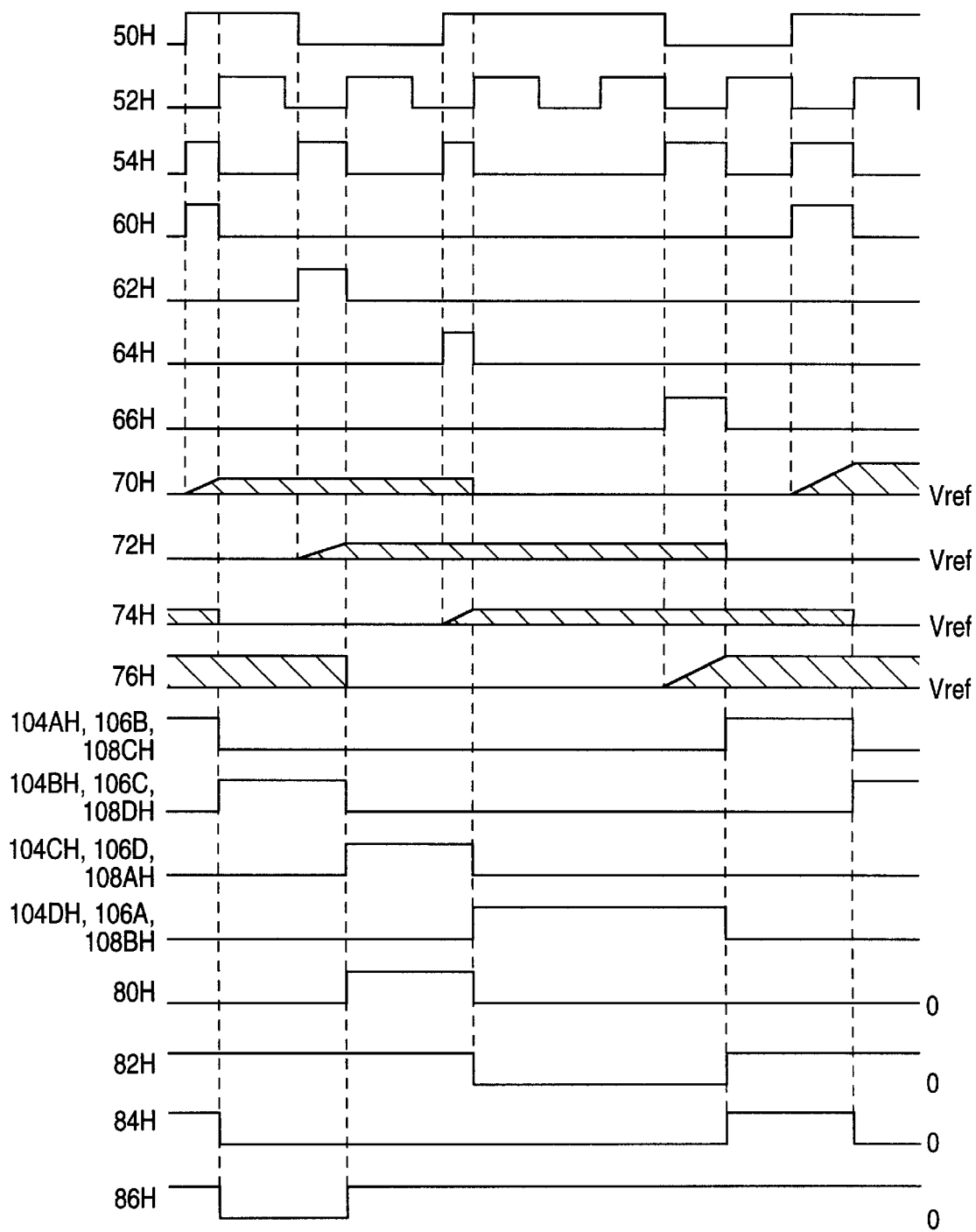
FIG. 5 shows signals illustrating the operation of the frequency difference detector in FIG. 4.

FIG. 5 shows signals illustrating the operation of frequency difference detector 40. For convenience of explanation, signals at the "H" signal paths are discussed and labeled with their respective signal path numerals.

During a first time period, initially control signal V104AH is high and the other control signals are low, reset signal V106B is high and the other reset signals are low, enable signal V108CH is high and the other enable signals are low, voltage signals V70H and V72H are at the reference voltage (Vref), voltage signals V74H and V76H are stored, and error pulse 184H is generated with an amplitude proportional to the voltage difference between voltage signals V74H and V76H and with a positive polarity since voltage signal V76H is larger than voltage signal V74H. Thereafter, the first edge of the NRZ signal V50H defines a leading edge of the first data pulse V54H, and the immediately following leading edge of reference signal V52H defines a lagging edge of the first data pulse V54H. The first data pulse V54H is routed as the first data pulse V60H and is acquired by voltage converter 96A. Accordingly, voltage signal V70H rises above the reference voltage by an amount proportional to the pulse width of the first data pulse V60H. The lagging edge of first data pulse V54H triggers a change in the control signals, the reset signals, and the enable signals, so that control signal V104BH is high and the other control signals are low, reset signal V106C is high and the other reset signals are low, and enable signal V108DH is high and the other enable signals are low. As a result, multiplexer 94 will route the next data pulse to voltage converter 96B, voltage signal V74H is reset to the reference voltage, error pulse 184H is discontinued, and error pulse 186H is generated with an amplitude proportional to the voltage difference between voltage signals V70H and V76H and a negative polarity since voltage signal 70H is smaller than voltage signal 76H.

During a second time period, the second edge of the NRZ signal V50H defines a leading edge of second data pulse V54H, and the immediately following leading edge of reference signal V52H defines a lagging edge of second data pulse V54H. Second data pulse V54H is routed as second data pulse V62H and acquired by voltage converter 96B. Accordingly, voltage signal V72H rises above the reference voltage by an amount proportional to the pulse width of the second data pulse V62H. The lagging edge of the second data pulse V54H triggers a change in the control signals, the reset signals, and the enable signals, so that control signal V104CH is high and the other control signals are low, reset signal V106D is high and the other reset signals are low, and enable signal I08AH is high and the other enable signals are low. As a result, multiplexer 94 will route the next data pulse to voltage converter 96C, voltage signal V76H is reset to the reference voltage, error pulse I86H is discontinued, and error pulse I80H is generated with an amplitude proportional to the voltage difference between voltage signals V70H and V72H and with a positive polarity since voltage signal V72H is larger than voltage signal V70H.

During a third time period, the third edge of the NRZ signal V50H defines a leading edge of the third data pulse V54R, and the immediately following leading edge of reference signal V52H defines a lagging edge of the third data pulse V54H. The third data pulse V54H is routed as third data pulse V64H and acquired by voltage converter 96C. Accordingly, voltage signal V74H rises above the reference voltage by an amount proportional to the pulse width of the third data pulse V64H. The lagging edge of the third data pulse V54H triggers a change in the control signals, the reset signals, and the enable signals, so that control signal V104DH is high and the other control signals are low, reset signal V106A is high and the other reset signals are low, and enable signal 108BH is high and the other enable signals are low. As a result, multiplexer 94 will route the next data pulse to voltage converter 96D, voltage signal V70H is reset to the reference voltage, error pulse I80H is discontinued, and error pulse I82H is generated with an amplitude proportional to the voltage difference between voltage signals V72H and V74H and with a negative polarity since voltage signal V74H is smaller than voltage signal V72H.

During a fourth time period, the fourth edge of the NRZ signal V50H defines a leading edge of the fourth data pulse V54H, and the immediately following leading edge of reference signal V52H defines a lagging edge of fourth data pulse V54H. Fourth data pulse V54H is routed as fourth data pulse V66H and acquired by voltage converter 96D. Accordingly, voltage signal V76H rises above the reference voltage by an amount proportional to the pulse width of the fourth data pulse V66H. The lagging edge of the fourth data pulse V54H triggers a change in the control signals, the reset signals, and the enable signals, so that control signal V104AH is high and the other control signals are low, reset signal V106B is high and the other reset signals are low, and enable signal 108CH is high and the other enable signals are low. As a result, multiplexer 94 will route the next data pulse to voltage converter 96A, voltage signal V72H is reset to the reference voltage, error pulse I82H is discontinued, and error pulse I84H is generated with an amplitude proportional to the voltage difference between voltage signals V74H and V76H and with a positive polarity since voltage signal V76H is larger than voltage signal V74H.

During a fifth time period, the fifth edge of the NRZ signal V50H defines a leading edge of the fifth data pulse V54H and the immediately following leading edge of reference signal V52H defines a lagging edge of the fifth data pulse V54H. The fifth data pulse V54H is routed as the fifth data pulse V60H and is acquired by voltage converter 96A. Accordingly, voltage signal V70H rises above the reference voltage by an amount proportional to the pulse width of the fifth data pulse V60H. The lagging edge of the fifth data pulse V54H triggers a change in the control signals, the reset signals, and the enable signals, so that control signal V104BH is high and the other control signals are low, reset signal V106C is high and the other reset signals are low, and enable signal 108DH is high and the other enable signals are low. As a result, multiplexer 94 will route the next data pulse to voltage converter 96B, voltage signal V74H is reset to the reference voltage, error pulse I84H is discontinued, and error pulse I86H is generated with an amplitude proportional to the voltage difference between voltage signals V70H and V76H. Since voltage signals V70H and V76H have about the same voltage amplitude, current pulse 186H has a negligible current amplitude.

It should be noted that a data pulse and an error pulse are generated for each edge of the NRZ signal. That is, the data pulses and the error pulses have a repetition rate that corresponds to the edges of the NRZ signal.

Figure 6:
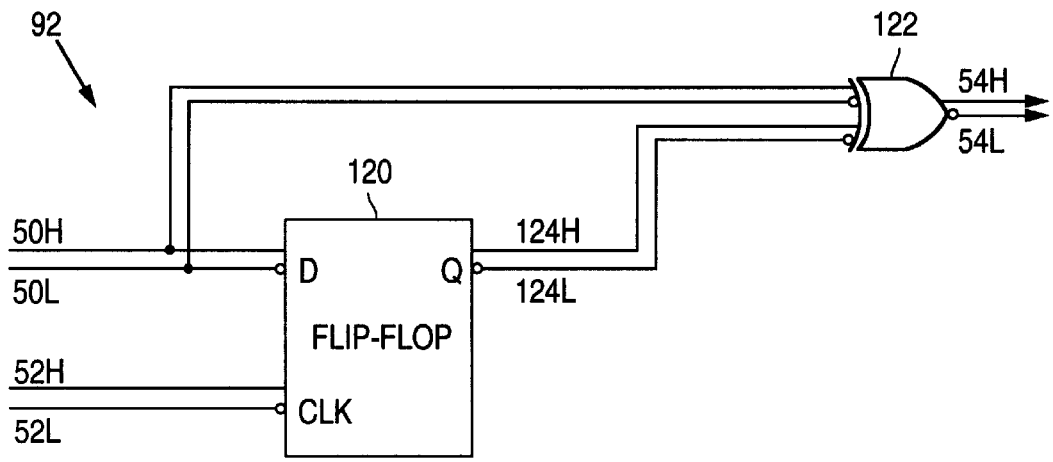
FIG. 6 shows an implementation for the edge difference-to-pulse converter of the frequency difference detector in FIG. 4.

FIG. 6 shows an implementation for edge difference-to-pulse converter 92 using flip-flop 120 and XOR gate 122. Flip-flop 120 has data inputs coupled to signal paths 50H and 50L, clock inputs coupled to signal paths 52H and 52L, and data outputs coupled to signal paths 124H and 124L. XOR gate 122 has a first input coupled to signal paths 50H and 50L, a second input coupled to signal paths 124H and 124L, and an output coupled to signal paths 54H and 54L. Thus, flip-flop 120 receives the NRZ signal at its data input and is clocked by the reference signal, and XOR gate 122 receives the NRZ signal and the data output of flip-flop 120 at its inputs and provides the data pulses at its output. Flip-flop 120 is triggered by the leading edge of the clock input. Furthermore, flip-flop 120 receives at least one clock cycle from the reference signal between each edge of the NRZ signal. Therefore, XOR gate 122 provides the data pulse with a leading edge defined by the edge of the NRZ signal and a lagging edge defined by the immediately following leading edge of the reference signal. In this manner, each edge of the NRZ signal initiates a data pulse and each immediately following leading edge of the reference signal quelches the data pulse.

For instance, when the NRZ signal has an edge that transitions from low to high at signal path 50H, immediately before the edge the signal at signal path 124H is low (because flip-flip 120 has received at least one clock cycle since the previous NRZ edge) and therefore XOR gate 122 receives low signals from signal paths 50H and 124H and provides a low signal at signal path 54H. When the edge in the NRZ signal occurs, XOR gate 122 receives a high signal at signal path 50H and a low signal at signal path 124H and provides a high signal (and the leading edge of the data pulse) at signal path 54H. Thereafter, when the next edge of the reference signal transitions from low to high at signal path 52H, flip-flop 120 is triggered and provides a high signal at signal path 124H, forcing XOR gate 122 to provide a low signal (and the lagging edge of the data pulse) at signal path 54H.

Similarly, when the NRZ signal has an edge that transitions from high to low at signal path 50H, immediately before the edge the signal at signal path 124H is high (because flip-flip 120 has received at least one clock cycle since the previous NRZ edge) and therefore XOR gate 122 receives high signals from signal paths 50H and 124H and provides a low signal at signal path 54H. When the edge in the NRZ signal occurs, XOR gate 122 receives a low signal at signal path 50H and a high signal at signal path 124H and provides a high signal (and the leading edge of the data pulse) at signal path 54H. Thereafter, when the next edge of the reference signal transitions from low to high at signal path 52H, flip-flop 120 is triggered and provides a low signal at signal path 124H, forcing XOR gate 122 to provide a low signal (and the lagging edge of the data pulse) at signal path 54H.

Figure 7:
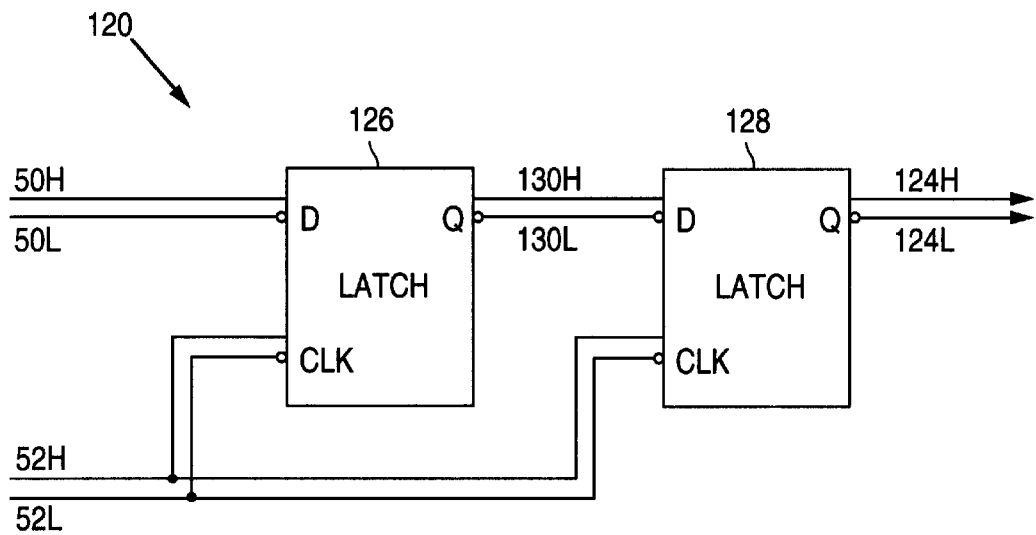
FIG. 7 shows an implementation for the flip-flop of the edge difference-to-pulse converter in FIG. 6.

FIG. 7 shows an implementation for flip-flop 120 using cascaded master-slave latches 126 and 128. Latch 126 has data inputs coupled to signal paths 50H and 50L, clock inputs coupled to signal paths 52H and 52L, and data outputs coupled to signal paths 130H and 130L. Latch 128 has data inputs coupled to signal paths 130H and 130L, clock inputs coupled to signal paths 52H and 52L, and data outputs coupled to signal paths 124H and 124L. Signal path 52H is coupled to the "L" clock input of latch 126 and the "H" clock input of latch 128, and signal path 52L is coupled to the "H" clock input of latch 126 and the "L" clock input of latch 128.

Latches 126 and 128 each pass the data input to the data output when the "H" clock input is high and the "L" clock input is low, and store the data output regardless of the data input when the "H" clock input is low and the "L" clock input is high.

For instance, when the NRZ signal is high at signal path 50H, and the reference signal is low at signal path 52H, then latch 126 transfers the high signal from signal path 50H to signal path 130H, but latch 128 stores whatever signal it previously provided at signal path 124H. Thereafter, when the reference signal transitions to high at signal path 52H, latch 126 stores the high signal at signal path 130H and latch 128 transfers the high signal from signal path 130H to signal path 124H.

Similarly, when the NRZ signal is low at signal path 50H, and the reference signal is low at signal path 52H, then latch 126 transfers the low signal from signal path 50H to signal path 130H, but latch 128 stores whatever signal it previously provided at signal path 124H. Thereafter, when the reference signal transitions to high at signal path 521H, latch 126 stores the low signal at signal path 130H and latch 128 transfers the low signal from signal path 130H to signal path 124H.

Figure 8:
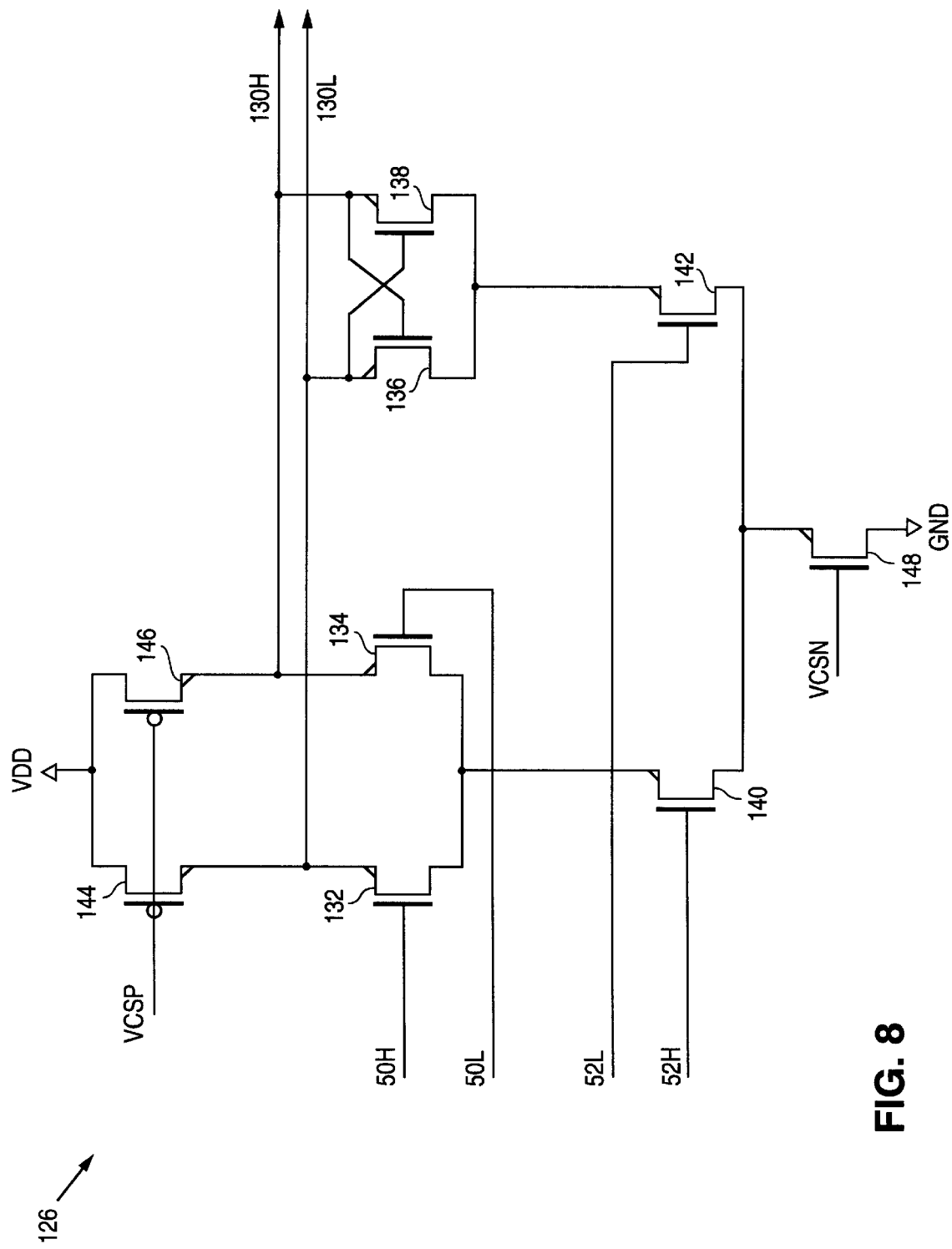
FIG. 8 shows an implementation for the latch of the flip-flop in FIG. 7.

FIG. 8 shows an implementation for latch 126 using a first differential stage provided by transistors 132 and 134, a second differential stage provided by transistors 136 and 138, and a third differential stage provided by transistors 140 and 142. Latch 126 also includes transistors 144 and 146 for providing voltage controlled load resistors, and transistor 148 for providing a current source. Voltage VCSP (2 volts) biases transistors 144 and 146, and voltage VSCN (1 volt) biases transistor 148. Transistors 132 and 134 are coupled to signal paths 50H and 50L, respectively, and transistors 140 and 142 are coupled to signal paths 52H and 52L, respectively. Transistors 132, 134, 136 and 138 have 6 micron channel widths and 0.6 micron channel lengths, and transistors 140, 142, 144, 146 and 148 have 12 micron channel widths and 0.6 micron channel lengths.

Applying a high signal at signal path 52H and a low signal at signal path 52L turns on transistor 140 and turns off transistor 142. This allows transistors 132 and 134 to control the signals at signal paths 130H and 130L in response to the signals at signal paths 50H and 50L, and prevents transistors 136 and 138 from affecting signal paths 130H and 130L. For instance, a high signal at signal path 50H and a low signal at signal path 50L turns on transistor 132 and turns off transistor 134, thereby providing a high signal at signal path 130H and a low signal at signal path 130L. Likewise, a low signal at signal path 50H and a high signal at signal path 50L turns off transistor 132 and turns on transistor 134, thereby providing a low signal at signal path 130H and a high signal at signal path 130L.

Applying a low signal at signal path 52H and a high signal at signal path 52L turns off transistor 140 and turns on transistor 142. This allows transistors 136 and 138 to store whatever signals are at signal paths 130H and 130L, and prevents transistors 132 and 134 from affecting signal paths 130H and 130L. For instance, a high signal at signal path 130H and a low signal at signal path 130L turns on transistor 136 and turns off transistor 138, thereby preserving the signals. Likewise, a low signal at signal path 130H and a high signal at signal path 130L turns off transistor 136 and turns on transistor 138, thereby preserving the signals.

Latch 128 is designed in the same manner as latch 126.

Figure 9:
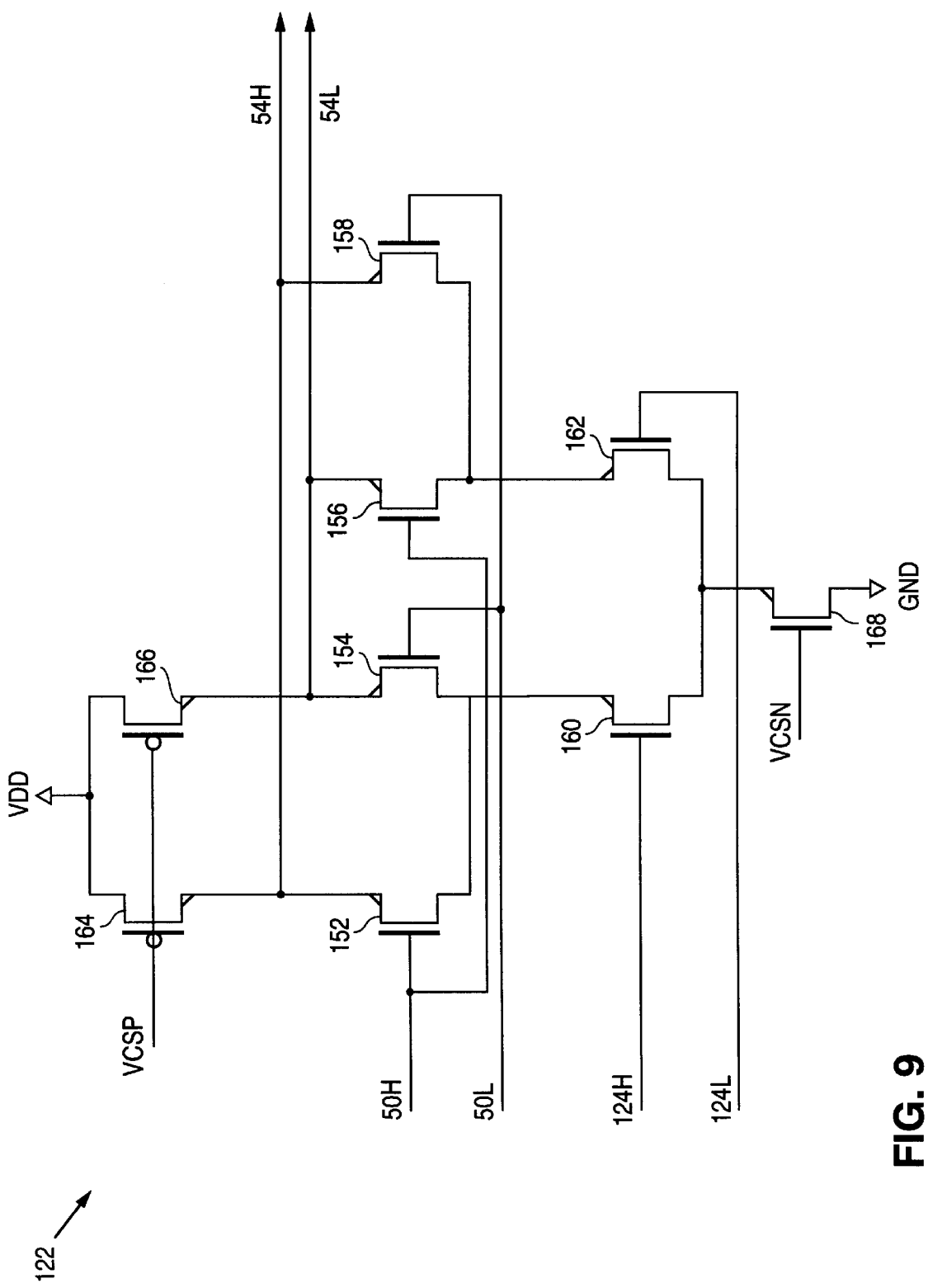
FIG. 9 shows an implementation for the exclusive-OR gate of the edge difference-to-pulse converter in FIG. 6.

FIG. 9 shows an implementation for XOR gate 122 using a first differential stage provided by transistors 152 and 154, a second differential stage provided by transistors 156 and 158, and a third differential stage provided by transistors 160 and 162. XOR gate 122 also includes transistors 164 and 166 for providing voltage controlled load resistors, and transistor 168 for providing a current source. Voltage VCSP biases transistors 164 and 166, and voltage VSCN biases transistor 168. Transistors 152 and 154 are coupled to signal paths 50H and 50L, respectively, transistors 156 and 158 are coupled to signal paths 50H and 50L, respectively, and transistors 160 and 162 are coupled to signal paths 124H and 124L, respectively. Transistors 152, 154, 156, 158, 160 and 162 have 6 micron channel widths and 0.6 micron channel lengths, and transistors 164, 166 and 168 have 12 micron channel widths and 0.6 micron channel lengths.

Applying a high signal at signal path 124H and a low signal at signal path 124L turns on transistor 160 and turns off transistor 162. This allows transistors 152 and 154 to control the signals at signal paths 54H and 54L in response to the signals at signal paths 50H and 50L, and prevents transistors 156 and 158 from affecting signal paths 54H and 54L. For instance, a high signal at signal path 50H and a low signal at signal path 50L turns on transistor 152 and turns off transistor 154, thereby providing a low signal at signal path 54H and a high signal at signal path 54L. Likewise, a low signal at signal path 50H and a high signal at signal path 50L turns off transistor 152 and turns on transistor 154, thereby providing a high signal at signal path 54H and a low signal at signal path 54L.

Applying a low signal at signal path 124H and a high signal at signal path 124L turns off transistor 160 and turns on transistor 162. This allows transistors 156 and 158 to control the signals at signal paths 54H and 54L in response to the signals at signal paths 50H and 50L, and prevents transistors 152 and 154 from affecting signal paths 54H and 54L. For instance, a high signal at signal path 50H and a low signal at signal path 50L turns on transistor 156 and turns off transistor 158, thereby providing a high signal at signal path 54H and a low signal at signal path 54L. Likewise, a low signal at signal path 50H and a high signal at signal path 50L turns off transistor 156 and turns on transistor 158, thereby providing a low signal at signal path 54H and a high signal at signal path 54L.

Thus, when the signals at signal paths 50H and 124H are low, or when the signals at signal paths 50H and 124H are high, then the signal at signal path 54H is low. Similarly, when the signal at signal path 50H is high and the signal at signal path 124H is low, or when the signal at signal path 50H is low and the signal at signal path 124H is high, then the signal at signal path 54H is low. Accordingly, the XOR function is provided.

XOR gates 110 and 112 are designed in a similar manner to XOR gate 122.

Figure 10:
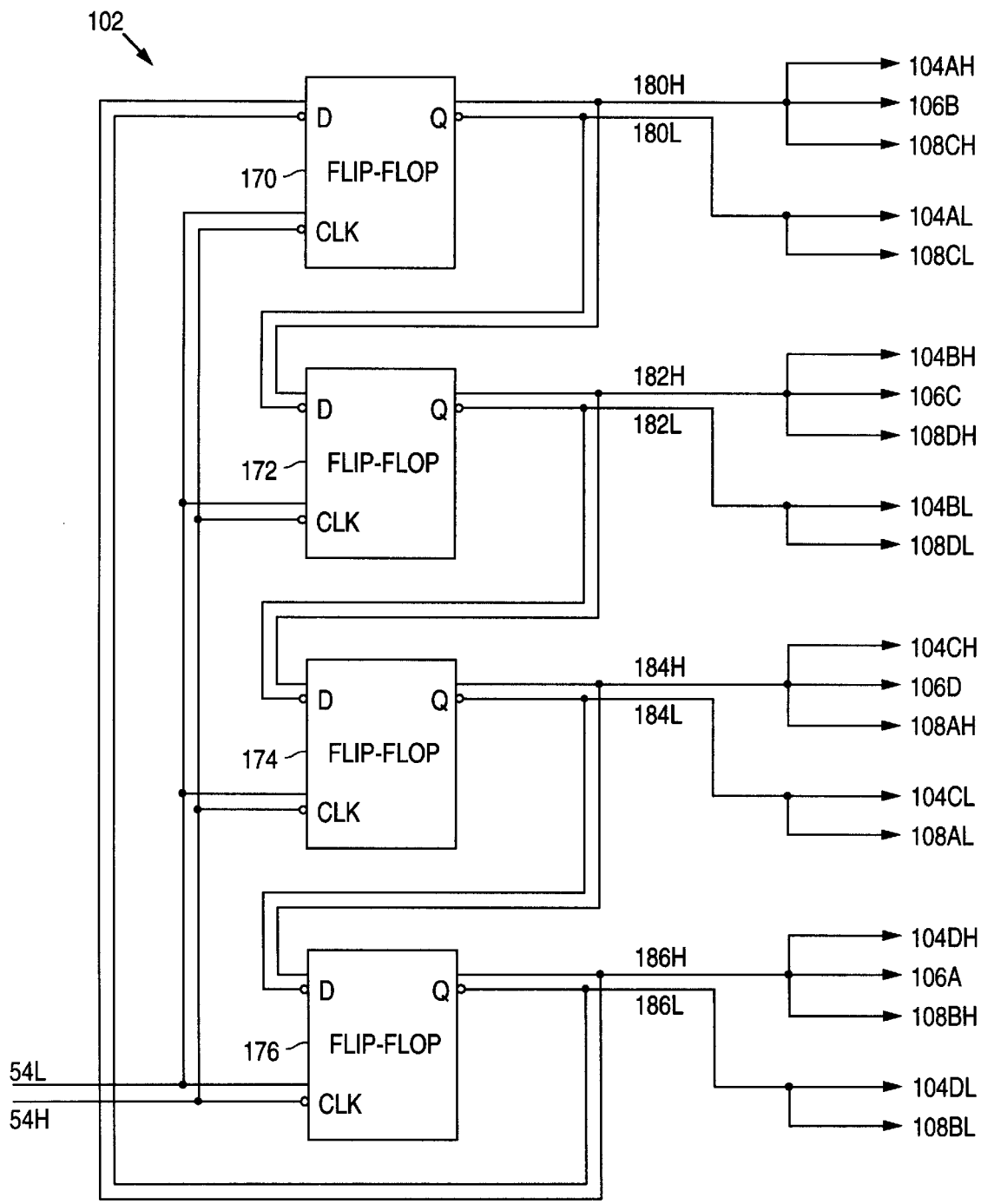
FIG. 10 shows an implementation for the signal generator of the frequency difference detector in FIG. 4.

FIG. 10 shows an implementation for signal generator 102 that includes serially interconnected flip-flops 170, 172, 174 and 176. Flip-flop 170 has data inputs coupled to signal paths 186H and 186L and data outputs coupled to signal paths 180A and 180B. Flip-flop 172 has data inputs coupled to signal paths 180H and 180L and data outputs coupled to signal paths 182H and 182L. Flip-flop 174 has data inputs coupled to signal paths 182H and 182L and data outputs coupled to signal paths 184H and 184L. Flip-flop 176 has data inputs coupled to signal paths 184H and 184L and data outputs coupled to signal paths 186H and 186L. Thus, each subsequent flip-flop receives the data output of a previous flip-flop. Flip-flops 170, 172, 174 and 176 have clock inputs coupled to signal paths 54H and 54L and therefore are clocked by the data pulses. Furthermore, since flip-flops 170, 172, 174 and 176 are triggered by the leading edges of the clock, the "H" clock inputs are coupled to signal path 54L, and the "L" clock inputs are coupled to signal path 54I, the flip-flops are clocked by the lagging edges of the data pulses.

Flip-flops 170, 172, 174 and 176 are initialized by providing a high signal at signal paths 180H, 182L, 184L and 186L and a low signal at signal paths 180L, 182H, 184H and 186H. Suitable initialization logic (not shown) is apparent to those skilled in the art.

Thereafter, each data pulse causes the signals at the data outputs to shift by one flip-flop in a cyclical manner. For instance, the first data pulse causes a high signal at signal path 182H and low signals at signal paths 180H, 184H and 186H. The second data pulse causes a high signal at signal path 184H and low signals at signal paths 180H, 182H and 186H. The third data pulse causes a high signal at signal path 186H and low signals at signal paths 180H, 182H and 184H. The fourth data pulse causes a high signal at signal path 180H and low signals at signal paths 182H, 184H and 186H. The fifth data pulse causes a high signal at signal path 182H and low signals at signal paths 180H, 184H and 186H, and so on.

As is seen, signal path 180H is coupled to signal paths 104AH, 106B and 108CH, signal path 180L is coupled to signal paths 104AL and 108CL, signal path 182H is coupled to signal paths 104BH, 106C and 108DH, signal path 182L is coupled to signal paths 104BL and 108DL, signal path 184H is coupled to signal paths 104CH, 106D and 108AH, signal path 184L is coupled to signal paths 104CL and 108AL, signal path 186H is coupled to signal paths 104DH, 106A and 108BH, and signal path 186L is coupled to signal paths 104DL and 108BL. In this manner, the appropriate control signals, reset signals and enable signals are generated in response to the lagging edges of the data pulses.

Figure 11:
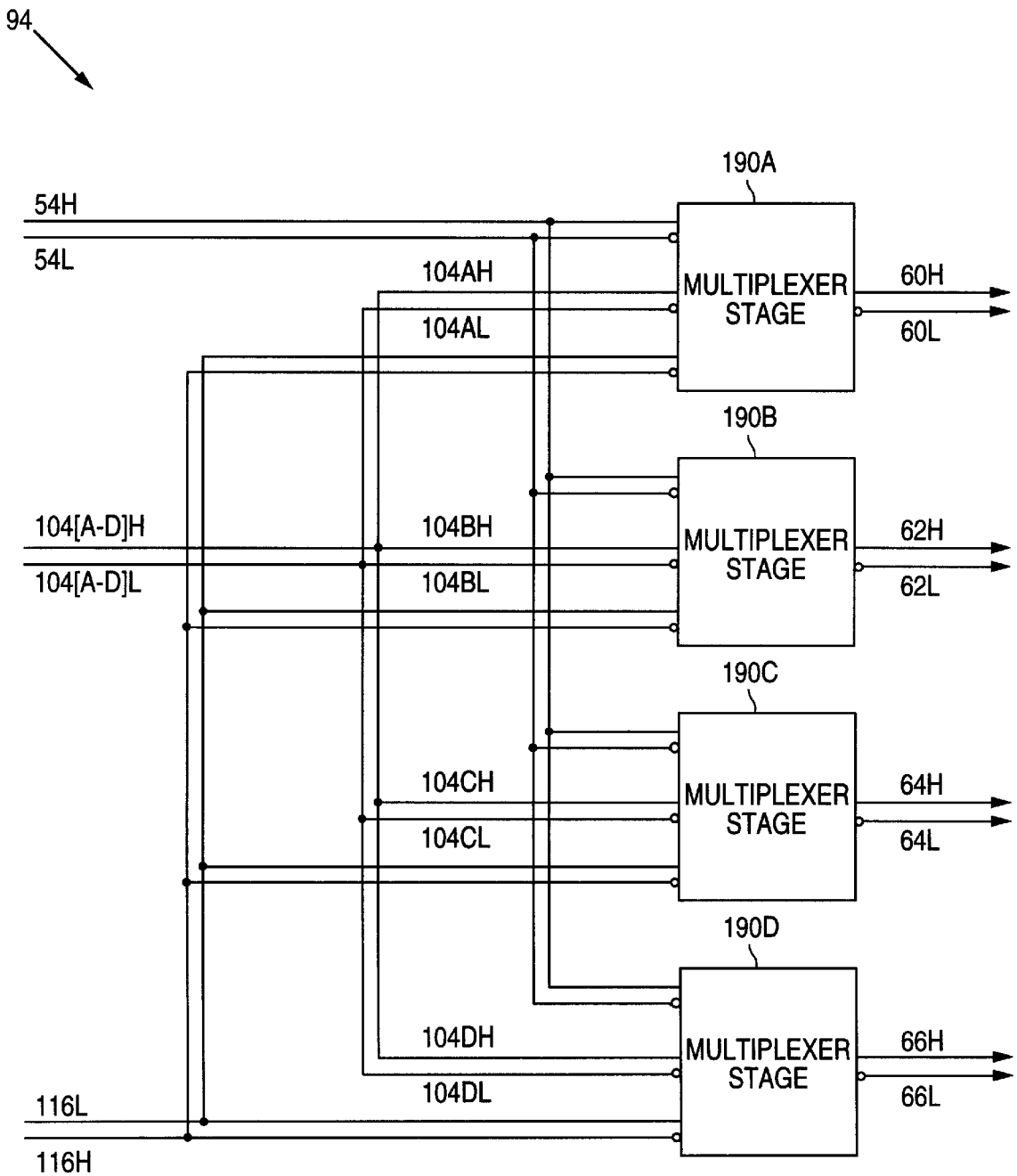
FIG. 11 shows an implementation for the multiplexer of the frequency difference detector in FIG. 4.

FIG. 11 shows an implementation for multiplexer 94 using multiplexer stages 190A, 190B, 190C and 190D. Multiplexer stages 190A, 190B, 190C and 190D are identical to one another. The multiplexer stages each have a first data input coupled to signal paths 54H and 54L for receiving the data pulses, a second data input coupled to signal paths 116H and 116L for receiving the dummy signals, and control inputs coupled to respective pairs of signal paths 104[A–D]H and 104[A–D]L. As mentioned above, only one of the differential control signal pairs is asserted at a time. Therefore, multiplexer stages 190A, 190B, 190C and 190D are configured to pass an incoming data pulse through only one of the stages, and to pass the dummy signals (representing the absence of a data pulse) through the other three stages.

Figure 12:
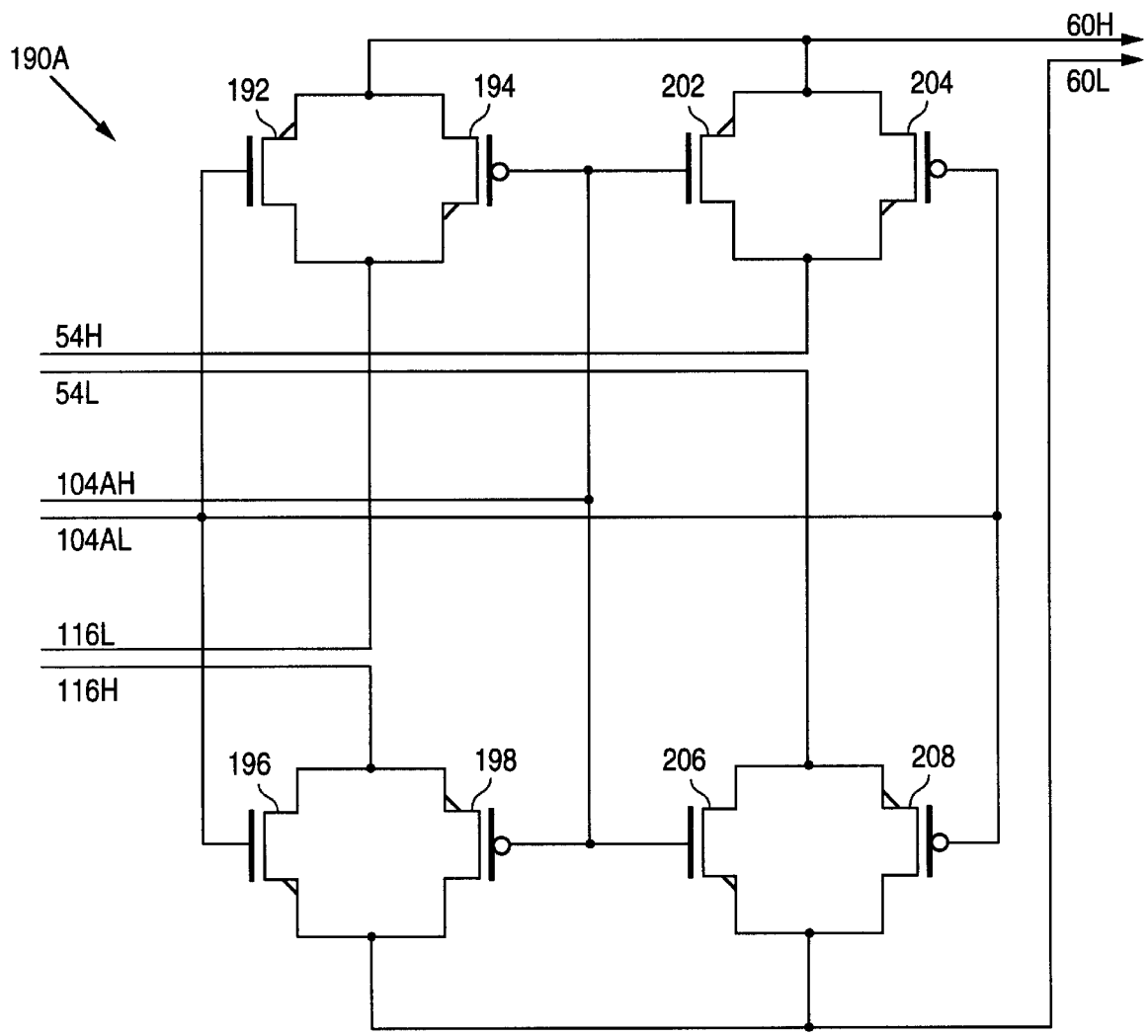
FIG. 12 shows an implementation for the multiplexer stage of the multiplexer in FIG. 11.

FIG. 12 shows an implementation for multiplexer stage 190A that includes transistors 192 and 194 as a first complementary pair, transistors 196 and 198 as a second complementary pair, transistors 202 and 204 as a third complementary pair, and transistors 206 and 208 as a fourth complementary pair. The transistors selectively couple signal paths 54H and 54L (the first data input) or signal paths 116L and 116H (the second data input) to signal paths 60H and 60L (the data output) in response the signals at signal paths 104AH and 104AL (the control input). Transistors 192, 194, 196, 198, 202, 204, 206 and 208 have 1.2 micron channel widths and 0.6 micron channel lengths.

Applying a high signal at signal path 104H and a low signal at signal path 104L turns off transistors 192, 194, 196, and 198 and turns on transistors 202, 204, 206 and 208. This allows transistors 202, 204, 206 and 208 to control the signals at signal paths 60H and 60L in response to the signals at signal paths 54H and 54L, and prevents transistors 192, 194, 196 and 198 from affecting signal paths 60H and 60L. For instance, transistors 202 and 204 couple signal path 54H to signal path 60H, and transistors 206 and 208 couple signal path 54L to signal path 60L.

Applying a low signal at signal path 104H and a high signal at signal path 104L turns on transistors 192, 194, 196, and 198 and turns off transistors 202, 204, 206 and 208. This allows transistors 192, 194, 196 and 198 to control the signals at signal paths 60H and 60L in response to the signals at signal paths 116L and 116H, and prevents transistors 202, 204, 206 and 208 from affecting signal paths 60H and 60L. For instance, transistors 192 and 194 couple signal path 116L to signal path 60H, and transistors 196 and 198 couple signal path 116H to signal path 60L.

Multiplexer stages 190B, 190C and 190D are designed in a similar manner to multiplexer stage 190A.

Figure 13:
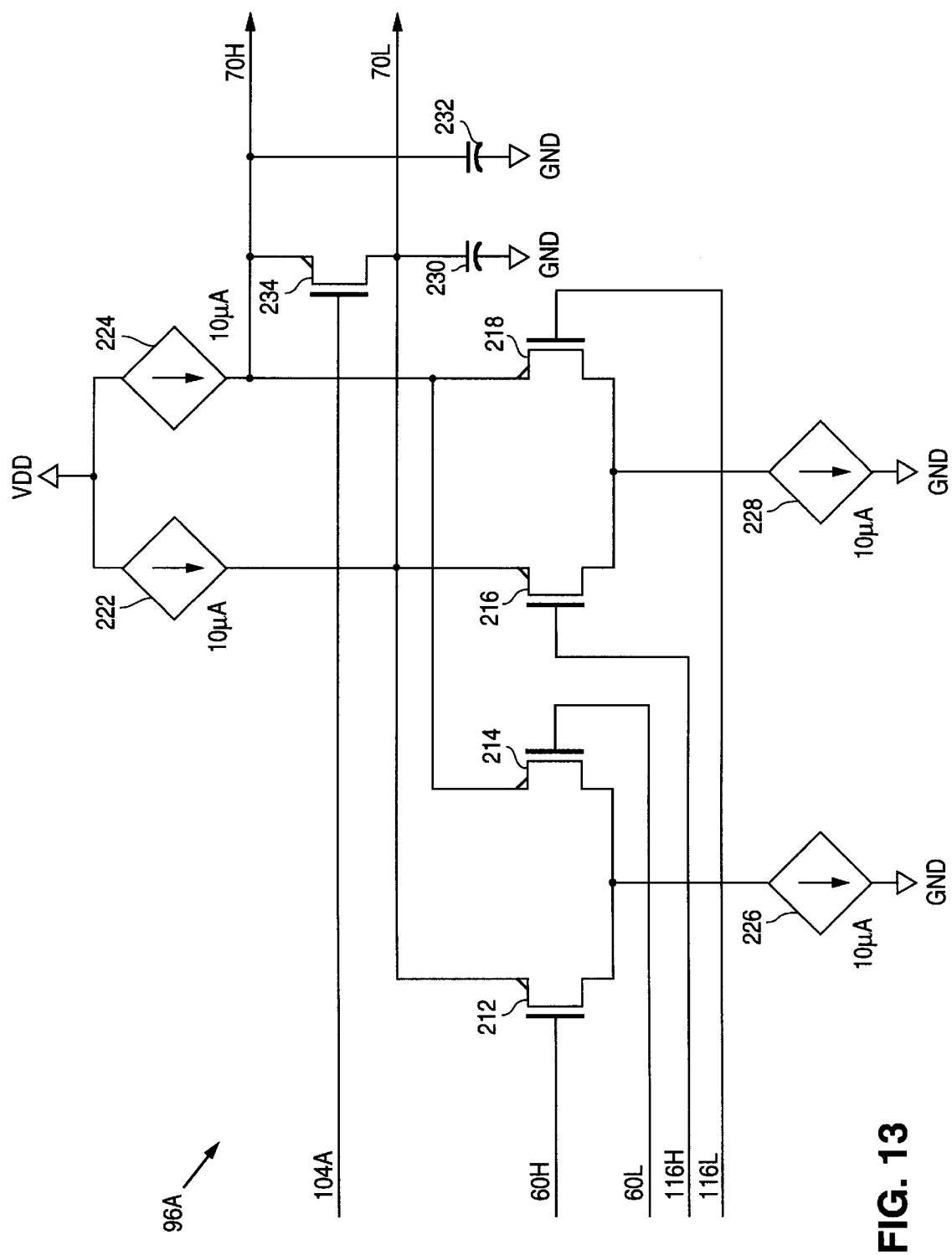
FIG. 13 shows an implementation for the pulse width-to-voltage converter of the frequency difference detector in FIG. 4.

FIG. 13 shows an implementation for voltage converter 96A that includes a first differential stage provided by transistors 212 and 214 and a second differential stage provided by transistors 216 and 218. Voltage converter 96A also includes current sources 222, 224, 226 and 228, capacitors 230 and 232, and equilibrating transistor 234. Current sources 222, 224, 226 and 228 are identical to one another and each source 10 microamps. Capacitors 230 and 232 are identical to one another and are coupled at nodes to signal paths 70H and 70L, respectively. Transistors 212, 214, 216 and 218 have 6micron channel widths and 1.2 micron channel lengths, and transistor 234 has a 1.2 micron channel width and a 0.6 micron channel length.

Since signal path 116H provides the high dummy signal and signal path 116L provides the low dummy signal, transistor 216 remains on and transistor 218 remains off. In the absence of a data pulse, signal path 60H is low and signal path 60L is high, thereby turning on transistor 214 and turning off transistor 212. Under these conditions, the current from current source 222 is transferred through transistor 216 to current source 228, and capacitor 230 stores its charge. Likewise, the current from current source 224 is transferred through transistor 214 to current source 226, and capacitor 232 stores its charge. If capacitors 230 and 232 are storing a differential signal, then the voltages at signal paths 70H and 70L will be symmetric about a reference voltage, such as VDD/2. However, applying a reset signal at signal path 104A turns on transistor 234, thereby shorting capacitors 230 and 232, and resetting (or equilibrating) the voltage at signal paths 70H and 70L to the reference voltage. Thereafter, signal paths 70H and 70L remain at the reference voltage until a data pulse is received at signal paths 60H and 60L.

Applying a data pulse at signal paths 60H and 60L causes a high signal at signal path 60H and a low signal at signal path 60L, which turns on transistor 212 and turns off transistor 214. This couples current source 222 to current sources 226 and 228 and decouples current source 224 from current sources 226 and 228. Since current source 222 can not supply enough current for current sources 226 and 228, charge is drawn from capacitor 230 and the voltage at signal path 70L ramps linearly towards ground. In addition, since current source 224 no longer supplies another current source, charge is deposited into capacitor 232 and the voltage at signal path 70H ramps linearly towards VDD. The longer this occurs, the more capacitor 232 charges and capacitor 230 discharges, and the greater the voltage separation between signal paths 70H and 70L. Stated differently, the amount that the voltages at signal paths 70H and 70L move away from the reference voltage is proportional to the length of time that signal path 60H is high and signal path 60L is low, i.e., the pulse width of the data pulse. Thereafter, the data pulse is quelched causing a low signal at signal path 60H and a high signal at signal path 60L, the current from current source 222 is transferred to current source 228, the current from current source 224 is transferred to current source 226, and capacitors 230 and 232 store their respective charges until the next reset operation occurs.

The pulse widths of the data pulses are not long enough for capacitor 232 to be charged to VDD or capacitor 230 to be discharged to ground. This assures that the voltages at signal paths 70H and 70L are proportional to the pulse width of the acquired data pulse.

Voltage converters 96B–96D are designed in the same manner as voltage converter 96A.

Figure 14:
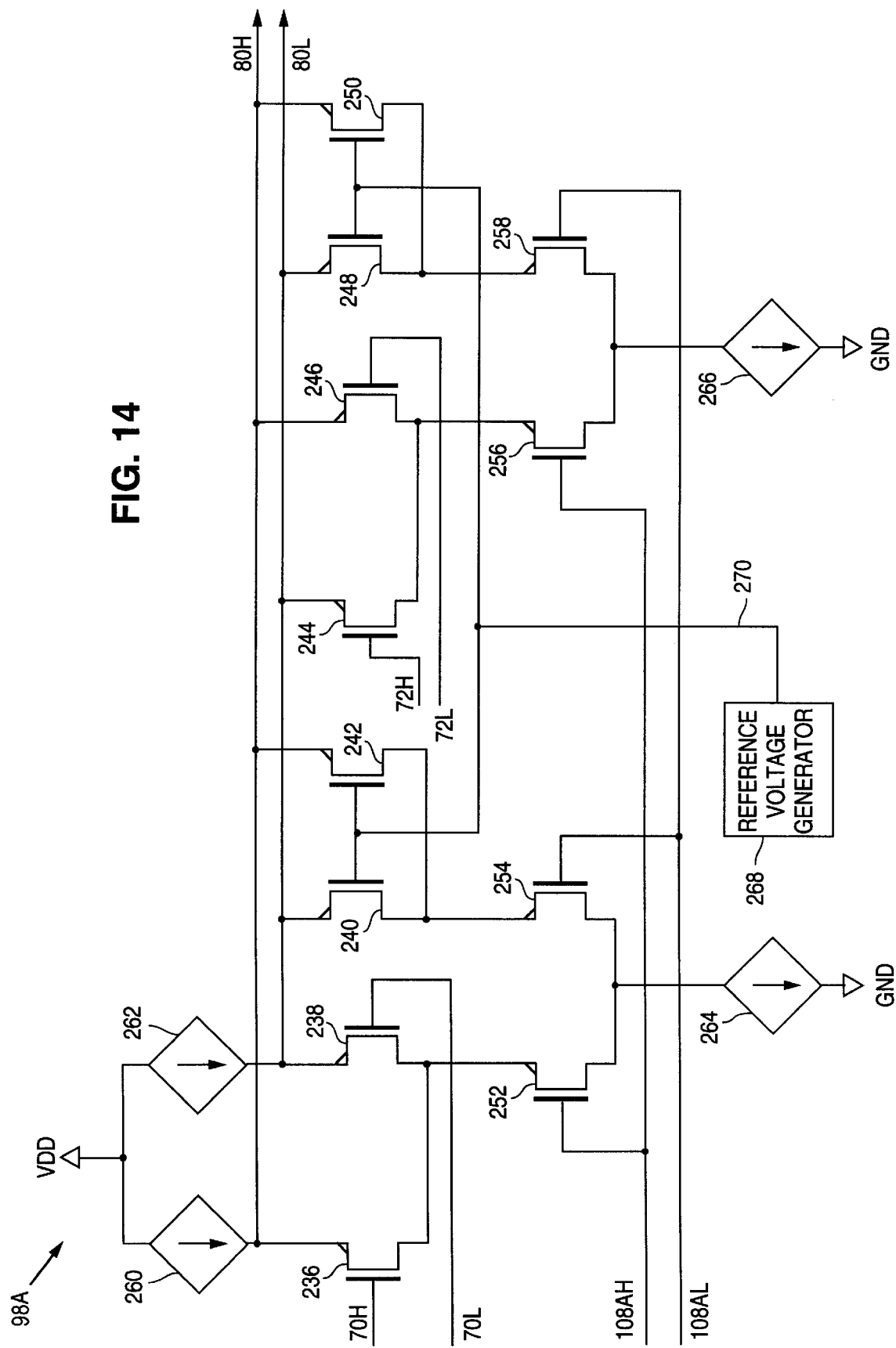
FIG. 14 shows an implementation for the voltage difference-to-current converter of the frequency difference detector in FIG. 4.

FIG. 14 shows an implementation for current converter 98A that includes a first differential stage provided by transistors 236 and 238, a second differential stage provided by transistors 240 and 242, a third differential stage provided by transistors 244 and 246, a fourth differential stage provided by transistors 248 and 250, a fifth differential stage provided by transistors 252 and 254, and a sixth differential stage provided by transistors 256 and 258. Current converter 98A also includes identical current sources 260, 262, 264 and 266 which each source 10 microamps, and reference voltage generator 268 for supplying the reference voltage. Transistors 236, 238, 240, 242, 244, 246, 248 and 250 have 6 micron channel widths and 1.2 micron channel lengths, and transistors 252, 254, 256 and 258 have 6 micron channel widths and 0.6 micron channel lengths. Signal paths 108AH and 108AL provide the enable signals that active or deactivate current converter 98A.

Applying a low signal at signal path 108AH and a high signal at signal path 108AL turns off transistors 252 and 256 and turns on transistors 254 and 258. Turning off transistor 252 prevents transistors 236 and 238 from affecting signal paths 80H and 80L, and turning off transistor 256 prevents transistors 244 and 246 from affecting signal paths 80H and 80L. Since signal paths 70H 70L, 72H and 72L are coupled to transistors 236, 238, 244 and 246, respectively, these signal paths are decoupled from signal paths 80H and 80L. Turning on transistor 254 allows transistors 240 and 242 to transfer current from current sources 262 and 260, respectively, and turning on transistor 258 allows transistors 248 and 250 to transfer current from current sources 262 and 260, respectively. Transistors 240, 242, 248 and 250 are biased by the reference voltage at signal path 270. Furthermore, transistors 240, 242, 248 and 250 have the same source voltage. As a result, transistors 240, 242, 248 and 250 each transfer 5 microamps of current. That is, transistor 240 transfers 5 microamps from current source 262 through transistor 254 to current source 264, transistor 242 transfers 5 microamps from current source 260 through transistor 254 to current source 264, transistor 248 transfers 5 microamps from current source 262 through transistor 258 to current source 266, and transistor 250 transfers 5 microamps from current source 260 through transistor 258 to current source 266. In this manner, the current supplied by current sources 260 and 262 is drawn by current sources 264 and 266, and no current flows between signal paths 80H and 80L.

Applying a high signal at signal path 108AH and a low signal at signal path 108AL turns on transistors 252 and 256 and turns off transistors 254 and 258. Turning off transistor 254 prevents transistors 240 and 242 from affecting signal paths 80H and 80L, and turning off transistor 258 prevents transistors 248 and 250 from affecting signal paths 80H and 80L. Turning on transistor 252 allows transistors 236 and 238 to draw current from current sources 260 and 262, respectively, and turning on transistor 256 allows transistors 244 and 246 to draw current from current sources 260 and 262, respectively.

When a voltage separation occurs at signal paths 70H and 70L the voltage at signal path 70H is greater than the voltage at signal path 70L, and likewise, when a voltage separation occurs at signal paths 72H and 72L the voltage at signal path 72H is greater than the voltage at signal path 72L. Thus, a voltage separation at signal paths 70H and 70L causes transistor 236 to draw more current than transistor 238, and a voltage separation at signal paths 72H and 72L causes transistor 244 to draw more current than transistor 246. Furthermore, an external load (not shown) is coupled between signal paths 80H and 80L.

When the voltage separation between signal paths 72H and 72L is greater than the voltage separation between signal paths 70H and 70L, the difference in current flow between transistors 244 and 246 is greater than the difference in current flow between transistors 236 and 238. That is, transistor 244 draws more current than transistor 236, and transistor 246 draws less current than transistor 238. Therefore, the combination of transistors 238 and 244 draws more current than the combination of transistors 236 and 246. Furthermore, the combination of transistors 238 and 244 draws more than the 10 microamps provided by current source 262 and the combination of transistors 236 and 246 draws less than 10 microamps provided by current source 260 since the combination of transistors 236 and 238 continues to draw 10 microamps for current source 264 and the combination of transistors 244 and 246 continues to draw 10 microamps for current source 266. As a result, some of the current from current source 260 flows out signal path 80H, through the external load and back into signal path 80L. This provides an error pulse with positive polarity.

Similarly, when the voltage separation between signal paths 70H and 70L is greater than the voltage separation between signal paths 72H and 72L, the difference in current flow between transistors 236 and 238 is greater than the difference in current flow between transistors 246 and 246. That is, transistor 236 draws more current than transistor 244, and transistor 238 draws less current than transistor 246. Therefore, the combination of transistors 236 and 246 draws more current than the combination of transistors 238 and 244. Furthermore, the combination of transistors 236 and 246 draws more than the 10 microamps provided by current source 260 and the combination of transistors 238 and 248 draws less than 10 microamps provided by current source 262 since the combination of transistors 236 and 238 continues to draw 10 microamps for current source 264 and the combination of transistors 244 and 246 continues to draw 10 microamps for current source 266. As a result, some of the current from current source 262 flows out signal path 80L, through the external load and back into signal path 80H. This provides an error pulse with negative polarity.

Accordingly, the current through signal paths 80H and 80L is directly proportional to the voltage difference between the voltage separation at signal paths 70H and 70L and the voltage separation at signal paths 72H and 72L. In addition, the polarity of the current through signal paths 80H and 80L is determined by the relative sizes of the voltage separations.

Current converters 98B–98D are designed in the same manner as current converter 98A.

Figure 15:
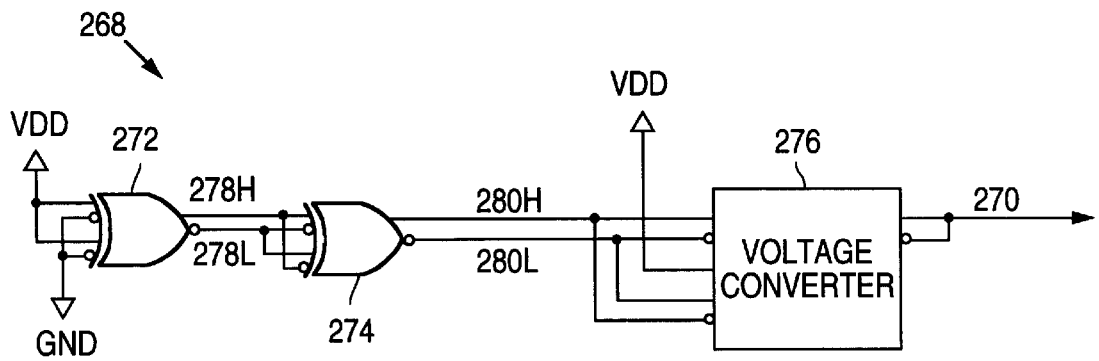
FIG. 15 shows an implementation for the reference voltage generator of the voltage difference-to-current converter in FIG. 14.

FIG. 15 shows an implementation for reference voltage generator 268 which includes XOR gates 272 and 274 and voltage converter 276. XOR gates 272 and 274 are designed in the same manner as XOR gate 122, and voltage converter 276 is designed in the same manner as voltage converter 96A. XOR gate 272 has its "H" inputs coupled to VDD and its "L" inputs coupled to GND, and therefore generates a low signal at signal path 278H and a high signal at signal path 278L. XOR gate 274 has its "H" inputs coupled to signal paths 278H and 278L and its "L" inputs coupled to signal paths 278H and 278L, and therefore generates a high signal at signal path 280H and a low signal at signal path 280L. Voltage converter 276 receives the high signal at the "HI" input of its first data input and the "L" input of the its second data input and receives the low signal at the "L" input of its first data input and the "H" input of its second data input. However, voltage converter 276 receives VDD at it reset input, thereby equilibrating its "H" and "L" outputs which are coupled to signal path 270. Accordingly, the reference voltage is generated at signal path 270.

Numerous variations can be made to the embodiments described above. For instance, the control signals, reset signals and enable signals can be triggered at different times and can have different pulse widths. The error pulses can be generated as voltage pulses by coupling resistors between signal paths 88H and 88L and ground. Likewise, the error pulses can be generated with a single polarity and/or with constant pulse widths and separated from one another. A single reference voltage generator that utilizes XOR gates 110 and 112 can provide the reference voltage for current converters 98A–98D, but providing current converters 98A–98D with their own reference voltage generators provides better transistor matching due to closer proximity. A demultiplexer can be coupled between voltage converters 96A–96D and current converter 98A to render current converters 96B–96D unnecessary.

It is understood that although a particularly important application of the frequency difference detector of the invention is in a frequency/phase-locked loop clock recovery circuit in which the reference signal is provided by a voltage controlled oscillator, the frequency difference detector has other significant applications in signal processing and is particularly well-suited for use in an integrated circuit chip in a computer system.

Other variations and modifications of the embodiments disclosed herein may be made based on the description set forth herein without departing from the scope and spirit of the invention as set forth in the following claims.

What is claimed is:

1. An apparatus including a frequency difference detector, the frequency difference detector comprising:

a pulse generator that receives an NRZ signal and a reference signal and provides data pulses having first edges based on edges of the NRZ signal and second edges based on edges of the reference signal;

a pulse router that routes the data pulses to different data paths;

a voltage generator that receives the data pulses from the data paths and provides voltage signals with amplitudes based on pulse widths of the data pulses; and a comparison circuit that receives the voltage signals and provides error pulses with amplitudes based on voltage differences between the voltage signals, wherein the amplitudes of the error pulses represent a frequency difference between the NRZ signal and the reference signal.

2. The apparatus of claim 1, wherein the pulse generator provides the data pulses with leading edges based on the edges of the NRZ signal and lagging edges based on trigger edges of the reference signal, with the trigger edges being one of leading and lagging edges of the reference signal immediately following the edges of the NRZ signal.

3. The apparatus of claim 2, wherein the pulse generator includes a flip-flop and an exclusive-OR gate, the flip-flop receives the NRZ signal at a data input and is clocked by the reference signal, and the exclusive-OR gate receives the NRZ signal and a data output of the flip-flop and provides the data pulses.

4. The apparatus of claim 1, wherein the pulse router includes a multiplexer that receives the data pulses at a data input and control signals at control inputs and routes the data pulses to the data paths in response to the control signals.

5. The apparatus of claim 4, further including a signal generator that includes serially interconnected flip-flops clocked by the data pulses that provide the control signals at data outputs for controlling the multiplexer.

6. The apparatus of claim 1, wherein the voltage generator includes nodes coupled to capacitors, the voltage signals are provided at the nodes, and the pulse widths of the data pulses determine how much the voltage signals differ from a reference voltage.

7. The apparatus of claim 6, further including a signal generator that includes serially interconnected flip-flops clocked by the data pulses that provide reset signals at data outputs for periodically resetting the nodes to the reference voltage.

8. The apparatus of claim 1, wherein the comparison circuit provides the error pulses with current amplitudes proportional to the voltage differences between the voltage signals and with polarities that represent a sign of the voltage differences between the voltage signals.

9. The apparatus of claim 8, further including a signal generator that includes serially interconnected flip-flops clocked by the data pulses that provide enable signals at data outputs for determining a duration of the error pulses.

10. The apparatus of claim 8, wherein the comparison circuit provides the error pulses with a repetition rate that corresponds to the edges of the NRZ signal.

11. The apparatus of claim 1, wherein:
the voltage generator includes four pulse width-to-voltage converters each coupled to a different one of the data paths; and
the comparison circuit includes four voltage difference-to-current converters each coupled to a different pair of the pulse width-to-voltage converters.

12. The apparatus of claim 1, further including a voltage controlled oscillator that provides the reference signal.

13. The apparatus of claim 1, further including a clock recovery circuit that includes the frequency difference detector.

14. The apparatus of claim 1, further including an integrated circuit chip that includes the frequency difference detector.

15. The apparatus of claim 14, further including a computer system that includes the integrated circuit chip.

16. An apparatus including a frequency difference detector, the frequency difference detector comprising:
an edge difference-to-pulse converter that receives an NRZ signal and a reference signal and provides a data signal, the NRZ signal including NRZ pulses, the reference signal including reference pulses, and the data signal including data pulses, wherein each edge of the NRZ pulses defines a leading edge of one of the data pulses, and each trigger edge of the reference pulses defines a lagging edge of one of the data pulses, with the trigger edge being one of a leading and lagging edge of the reference pulses that immediately follows each edge of the NRZ data;
a pulse router that routes the data pulses to different data paths;
pulse width-to-voltage converters that receive the data pulses from respective ones of the data paths and provide voltage signals with amplitudes based on pulse widths of the data pulses; and
voltage difference-to-current converters that receive the voltage signals from pairs of the pulse width-to-voltage converters and provide error pulses with current amplitudes and polarities based on voltage differences between the voltage signals, wherein the current amplitudes and polarities represent a frequency difference between the NRZ signal and the reference signal.

17. The apparatus of claim 16, wherein the edge difference-to-pulse converter includes a flip-flop and an exclusive-OR gate, the flip-flop receives the NRZ signal at a data input and is clocked by the reference signal, and the exclusive-OR gate receives the NRZ signal and a data output of the flip-flop and provides the data pulses.

18. The apparatus of claim 16, wherein the trigger edge is the leading edge.

19. The apparatus of claim 16, wherein the trigger edge is the lagging edge.

20. The apparatus of claim 16, wherein the voltage difference-to-current converters provide the error pulses with a repetition rate that corresponds to the edges of the NRZ pulses, with current amplitudes that are proportional to the frequency difference between the NRZ signal and the reference signal, and with polarities that represent a sign of the frequency difference between the NRZ signal and the reference signal.

21. The apparatus of claim 16, wherein:
the data paths include first, second, third and fourth signal paths;
the pulse router routes consecutive ones of the data pulses to the first, second, third and fourth signal paths in sequence;
the pulse width-to-voltage converters include first, second, third and fourth pulse width-to-voltage converters coupled to the first, second, third and fourth signal paths, respectively, and that receive first, second, third and fourth reset signals, respectively, in sequence; and
the voltage difference-to-current converters include first, second, third and fourth voltage difference-to-current converters, the first voltage difference-to-current converter is coupled to the first and second pulse width-to-voltage converters, the second voltage difference-to-current converter is coupled to the second and third pulse width-to-voltage converters, the third voltage difference-to-current converter is coupled to the third and fourth pulse width-to-voltage converters, the fourth voltage difference-to-current converter is coupled to the first and fourth pulse width-to-voltage converters, and the first, second, third and fourth voltage difference-to-current converters receive first, second, third and fourth enable signals, respectively, in sequence.

22. The apparatus of claim 21, wherein:
during a first time period in which only one edge of the NRZ signal occurs, the pulse router routes one of the data pulses to the first pulse width-to-voltage converter, the second reset signal resets the second pulse width-to-voltage converter to a reference voltage, the third and fourth pulse width-to-voltage converters provide two of the voltage signals based on a previous pair of the data pulses, and the third enable signal allows the third voltage difference-to-current converter to generate one of the error pulses;

during a second time period in which only one edge of the NRZ signal occurs, the pulse router routes one of the data pulses to the second pulse width-to-voltage converter, the third reset signal resets the third pulse width-to-voltage converter to the reference voltage, the first and fourth pulse width-to-voltage converters provide two of the voltage signals based on a previous pair of the data pulses, and the fourth enable signal allows the fourth voltage difference-to-current converter to generate one of the error pulses;

during a third time period in which only one edge of the NRZ signal occurs, the pulse router routes one of the data pulses to the third pulse width-to-voltage converter, the fourth reset signal resets the fourth pulse width-to-voltage converter to the reference voltage, the first and second pulse width-to-voltage converters provide two of the voltage signals based on a previous pair of the data pulses, and the first enable signal allows the first voltage difference-to-current converter to generate one of the error pulses; and during a fourth time period in which only one edge of the NRZ signal occurs, the pulse router routes one of the data pulses to the fourth pulse width-to-voltage converter, the first reset signal resets the first pulse width-to-voltage converter to the reference voltage, the second and third pulse width-to-voltage converters provide two of the voltage signals based on a previous pair of the data pulses, and the second enable signal allows the second voltage difference-to-current converter to generate one of the error pulses.

23. The apparatus of claim 22, wherein consecutive edges of the NRZ pulses occur during the first, second, third and fourth time periods.

24. The apparatus of claim 22, wherein the first, second, third and fourth time periods are consecutive and non-overlapping.

25. The apparatus of claim 22, further including a computer system that includes the frequency difference detector.

26. A frequency difference detector, comprising:

an edge difference-to-pulse converter that receives an NRZ signal and a reference signal and provides a data signal, the NRZ signal including NRZ pulses with edges between high and low values, the reference signal including reference pulses with edges between high and low values, and the data signal including data pulses with edges between high and low values, wherein each edge of the NRZ pulses defines a leading edge of one of the data pulses, and each trigger edge of the reference pulses defines a lagging edge of one of the data pulses, with the trigger edge being one of a leading and lagging edge of the reference pulses that immediately follows each edge of the NRZ data;

a multiplexer that receives the data pulses at a first data input and a dummy signal at a second data input and control signals at control inputs and routes the data pulses to first, second, third and fourth signal paths in sequence;

first, second, third and fourth pulse width-to-voltage converters coupled to the first, second, third and fourth signal paths, respectively, and that receive first, second, third and fourth reset signals, respectively, in sequence, and that provide voltage signals with amplitudes based on pulse widths of the data pulses; and first, second, third and fourth voltage difference-to-current converters, wherein the first voltage difference-to-current converter is coupled to the first and second pulse width-to-voltage converters, the second voltage difference-to-current converter is coupled to the second and third pulse width-to-voltage converters, the third voltage difference-to-current converter is coupled to the third and fourth pulse width-to-voltage converters, the fourth voltage difference-to-current converter is coupled to the first and fourth pulse width-to-voltage converters, and the first, second, third and fourth voltage difference-to-current converters receive first, second, third and fourth enable signals, respectively, in sequence, and provide error pulses with current amplitudes and polarities based on voltage differences between the voltage signals, wherein a repetition rate of the error pulses corresponds to the edges of the NRZ pulses, and the current amplitudes and polarities of the error pulses represent a frequency difference between the NRZ signal and the reference signal.

27. The frequency difference detector of claim 26, wherein the reference signal, the data signal and the NRZ signal are differential signals.

28. The frequency difference detector of claim 26, wherein the dummy signal is at about the low level of the data pulses.

29. A method of providing a frequency difference detector, comprising the steps of:

providing a frequency difference detector, the provided detector including:

a pulse generator that receives an NRZ signal and a reference signal and provides data pulses with leading edges based on edges of the NRZ signal and lagging edges based on edges of the reference signal;

a pulse router coupled to the pulse generator that routes the data pulses;

a voltage generator coupled to the pulse router that provides voltage signals with amplitudes based on pulse widths of the data pulses; and a comparison circuit coupled to the voltage generator that provides error pulses with a repetition rate that corresponds to the edges of the NRZ signal and with current amplitudes and polarities based on voltage differences between the voltage signals, wherein the current amplitudes and polarities represent a frequency difference between the NRZ signal and the reference signal.

30. The method of claim 29, wherein the pulse router routes consecutive ones of the data pulses to four signal paths in sequence.

31. The method of claim 29, wherein the pulse generator includes a flip-flop and an exclusive-OR gate, the flip-flop receives the NRZ signal at a data input and is clocked by the reference signal, and the exclusive-OR gate receives the NRZ signal and a data output of the flip-flop and provides the data pulses.

32. The method of claim 29, wherein the pulse router receives control signals from data outputs of serially interconnected flip-flops clocked by the data pulses.

33. The method of claim 29, further comprising the step of providing an integrated circuit chip that includes the provided frequency difference detector.

34. A frequency difference detector, comprising:
pulse generating means for receiving an NRZ signal and a reference signal and providing data pulses based on edges of the NRZ signal and the reference signal;
pulse routing means for routing the data pulses to different data paths
voltage generating means for receiving the data pulses from the data paths and for providing voltage signals with amplitudes based on pulse widths of the data pulses; and
comparison means for receiving the voltage signals and for providing error pulses with amplitudes based on voltage differences between the voltage signals, wherein the amplitudes of the error pulses represent a frequency difference between the NRZ signal and the reference signal.

35. A method of detecting a frequency difference between an NRZ signal and a reference signal, comprising the steps of:
receiving an NRZ signal with NRZ pulses and a reference signal with reference pulses;
providing data pulses to different data paths based on edges of the NRZ pulses and reference pulses;
providing voltage signals with amplitudes based on pulse widths of the data pulses; and
providing error pulses with amplitudes based on voltage differences between the voltage signals, wherein the amplitudes of the error pulses represent a frequency difference between the NRZ signal and the reference signal.

36. The method of claim 35, including providing the data pulses with first edges based on edges of the NRZ pulses and with second edges based on trigger edges of the reference signal, the trigger edges being one of leading and lagging edges of the reference signal immediately following the edges of the NRZ signal.

37. The method of claim 36, wherein the first edges are leading edges and the second edges are lagging edges.

38. The method of claim 37 wherein the trigger edges are the leading edges of the reference signal.

39. The method of claim 37, wherein the trigger edges are the lagging edges of the reference signal.

40. The method of claim 35, including routing consecutive ones of the data pulses along different signal paths.

41. The method of claim 40, including routing the data pulses using a multiplexer.

42. The method of claim 41, including applying the data pulses to clock inputs of serially interconnected flip-flops, and providing control signals at data outputs of the flip-flops for controlling the multiplexer.

43. The method of claim 35, including providing consecutive ones of the voltage signals at different nodes in response to consecutive ones of the data pulses.

44. The method of claim 43, including applying the data pulses to clock inputs of serially interconnected flip-flops, and providing reset signals at data outputs of the flip-flops for periodically resetting voltage levels at the nodes to a reference voltage.

45. The method of claim 35, including providing the error pulses with current amplitudes that are proportional to the voltage differences between the voltage signals and with polarities that represent a sign of the voltage differences between the voltage signals.

46. The method of claim 35, including applying the data pulses to clock inputs of serially interconnected flip-flops, and providing enable signals at data outputs of the flip-flops for determining a duration of the error pulses.

47. The method of claim 35, including providing the error pulses with a repetition rate that corresponds to the edges of the NRZ signal.

48. The method of claim 35, wherein the reference signal is generated by a voltage controlled oscillator in a clock recovery circuit.

49. The method of claim 35, wherein the reference signal is generated using a computer system.

50. A method of detecting a frequency difference between an NRZ signal and a reference signal, comprising the steps of:
receiving an NRZ signal including NRZ pulses;
receiving a reference signal including reference pulses from a voltage controlled oscillator;
providing a data signal with data pulses based on the NRZ signal and the reference signal, wherein each edge of the NRZ pulses defines a leading edge of one of the data pulses, and each trigger edge of the reference pulses defines a lagging edge of one of the data pulses, with the trigger edge being one of a leading and lagging edge of the reference pulses that immediately follows each edge of the NRZ data;
routing the data pulses to different data paths;
providing voltage signals with amplitudes based on pulse widths of the data pulses received from the data paths; and
providing error pulses with current amplitudes based on voltage differences between the voltage signals wherein the current amplitudes represent a frequency difference between the NRZ signal and the reference signal.

51. The method of claim 50, including providing the error pulses with a repetition rate that corresponds to the edges of the NRZ pulses, with current amplitudes that are proportional to the frequency difference between the NRZ signal and the reference signal, and with a polarity that represents a sign of the frequency difference between the NRZ signal and the reference signal.

52. The method of claim 50, wherein the data paths include first, second, third and fourth signal paths.

53. The method of claim 52, including during a time period in which only one edge of the NRZ signal occurs:
routing one of the data pulses to one of the data paths;
providing one of the voltage signals based on the one of the data pulses;
providing two of the voltage signals based on a previous pair of the data pulses; and
providing one of the error signals based on the two of the voltage signals.

54. The method of claim 53, including during the time period, resetting another one of the voltage signals to a reference voltage.

55. A method of detecting a frequency difference between an NRZ signal and a reference signal, comprising the steps of:
receiving an NRZ signal including NRZ pulses with edges between high and low levels that include first, second, third, fourth and fifth edges that occur consecutively and in sequence during first, second, third, fourth and fifth time periods, respectively;
receiving a reference signal including reference pulses with edges between high and low levels;
providing a data signal including data pulses with edges between high and low levels based on the NRZ signal and the reference signal, wherein the data pulses include first, second, third, fourth, and fifth data pulses that occur consecutively and in sequence during the first, second, third, fourth, and fifth time periods, respectively; and providing error pulses with amplitudes based on differences between pulse widths of the data pulses, wherein the amplitudes of the error pulses represent a frequency difference between the NRZ signal and the reference signal, wherein the error pulses include first, second and third error pulses that occur consecutively and in sequence during the third, fourth and fifth time periods, respectively.

56. The method of claim 55, including:

during the first time period, acquiring a first voltage signal at a first node with an amplitude corresponding to a pulse width of the first data pulse;

during the second time period, acquiring a second voltage signal at a second node with an amplitude corresponding to a pulse width of the second data pulse, and storing the first voltage signal at the first node; and during the third time period, acquiring a third voltage signal at a third node with an amplitude corresponding to a pulse width of the third data pulse, storing the first and second voltage signals at the first and second nodes, respectively, and generating the first error pulse with an amplitude corresponding to a voltage difference between the first and second voltage signals.

57. The method of claim 56, including:

during the fourth time period, acquiring a fourth voltage signal at a fourth node with an amplitude corresponding to a pulse width of the fourth data pulse, resetting the first node to a reference voltage, storing the second and third voltage signals at the second and third nodes, respectively, and generating the second error pulse with an amplitude corresponding to a voltage difference between the second and third voltage signals.

58. The method of claim 57, including:

during the fifth time period, acquiring a fifth voltage signal at the first node with an amplitude corresponding to a pulse width of the fifth data pulse, resetting the second node to the reference voltage, storing the third and fourth voltage signals at the third and fourth nodes, respectively, and generating the third error pulse with an amplitude corresponding to a voltage difference between the third and fourth voltage signals.

59. The method of claim 58, wherein each edge of the NRZ pulses defines a leading edge of one of the data pulses, and each trigger edge of the reference pulses defines a lagging edge of one of the data pulses, with the trigger edge being one of a leading and lagging edge of the reference pulses that immediately follows each edge of the NRZ data.

60. A method of detecting a frequency difference between an NRZ signal and a reference signal, comprising the steps of:

applying an NRZ signal and a reference signal to a pulse generator that provides data pulses with leading edges based on edges of the NRZ signal and lagging edges based on edges of the reference signal;

applying the data pulses to a multiplexer;

routing the data pulses from the multiplexer to a voltage generator that provides voltage signals with amplitudes based on pulse widths of the data pulses; and applying the voltage signals to a comparison circuit that provides error pulses with a repetition rate that corresponds to the edges of the NRZ signal, with current amplitudes proportional to voltage differences between the voltage signals, and with polarities representing a sign of the voltage differences between the voltage signals, wherein the error pulses represent a frequency difference between the NRZ signal and the reference signal.

61. The method of claim 60, wherein the pulse generator includes a flip-flop and an exclusive-OR gate, the flip-flop receives the NRZ signal at a data input and is clocked by the reference signal, and the exclusive-OR gate receives the NRZ signal and a data output of the flip-flop and provides the data pulses.

62. The method of claim 60, wherein the multiplexer routes consecutive ones of the data signals to four signal paths in sequence.

63. The method of claim 60, wherein the multiplexer receives control signals and the voltage generator receives reset signals from data outputs of serially interconnected flip-flops clocked by the data pulses.

64. The method of claim 63, wherein the comparison circuit receives enable signals from the data outputs of the flip-flops.

65. The method of claim 60, including providing the reference signal using a voltage controlled oscillator in a clock recovery circuit in a computer system.

* * * * *